(12) United States Patent
Lim et al.

(10) Patent No.: US 11,777,510 B2
(45) Date of Patent: Oct. 3, 2023

(54) FRACTIONAL DIVIDER WITH PHASE SHIFTER AND FRACTIONAL PHASE LOCKED LOOP INCLUDING THE SAME

(71) Applicant: Samsung Electronics Co., Ltd., Suwon-si (KR)

(72) Inventors: Baekmin Lim, Suwon-si (KR); Seungjin Kim, Suwon-si (KR); Seunghyun Oh, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/964,377

(22) Filed: Oct. 12, 2022

(65) Prior Publication Data

US 2023/0170912 A1 Jun. 1, 2023

(51) Int. Cl.
 *H03L 7/197* (2006.01)
 *H03L 7/093* (2006.01)
 *H03L 7/081* (2006.01)

(52) U.S. Cl.
 CPC ............ *H03L 7/1976* (2013.01); *H03L 7/081* (2013.01); *H03L 7/093* (2013.01)

(58) Field of Classification Search
 CPC ........ H03L 7/1976; H03L 7/081; H03L 7/093
 See application file for complete search history.

(56) References Cited

U.S. PATENT DOCUMENTS 6,392,493 B1 * 5/2002 Minnis ................ H03C 3/0933
 327/159
8,024,598 B2 9/2011 Kim et al.
(Continued)

FOREIGN PATENT DOCUMENTS

CN 106537785 A * 3/2017 ............... G06F 1/04
CN 207399178 U * 5/2018 ............ H03L 7/081
(Continued)

OTHER PUBLICATIONS

Santiccioli, et al. "A 1.6-to-3.0-GHz Fractional-N MDLL With a Digital-to-Time Converter Range-Reduction Technique Achieving 397-fs Jitter at 2.5-mW Power" IEEE Journal of Solid-State Circuits, vol. 54, No. 11, pp. 3149-3160(2019).

*Primary Examiner* — Adam D Houston
(74) *Attorney, Agent, or Firm* — Harness, Dickey & Pierce, P.L.C.

(57) ABSTRACT

A fractional divider processing circuitry is to receive one of a plurality of clock signals as an input clock signal, and generate a first division clock signal based on the input clock signal and a first control signal. Phases of the plurality of clock signals partially overlap each other. The processing circuitry generates a delta-sigma modulation signal based on the first division clock signal and a frequency control word, and generates a second division clock signal based on the plurality of clock signals, the first division clock signal and a second control signal. The second control signal corresponds to a quantization noise of the delta-sigma modulation signal. The processing circuitry generates the second control signal and a digital control word based on the quantization noise of the delta-sigma modulator. The processing circuitry generates a final division clock signal based on the second division clock signal and the digital control word.

20 Claims, 16 Drawing Sheets

(56) References Cited

U.S. PATENT DOCUMENTS

| | | | |
|---|---|---|---|
| 8,384,452 B1* | 2/2013 | Parker | H03L 7/18 |
| | | | 327/147 |
| 9,094,023 B2 | 7/2015 | Shin | |
| 9,379,714 B1* | 6/2016 | Xiu | G01S 7/4865 |
| 9,634,678 B1* | 4/2017 | Caffee | H03L 7/187 |
| 9,838,026 B2 | 12/2017 | Van Brunt et al. | |
| 10,084,623 B1* | 9/2018 | Mactaggart | H04L 7/0033 |
| 10,103,741 B2 | 10/2018 | Gao | |
| 10,200,047 B2 | 2/2019 | Markulic et al. | |
| 10,205,459 B2 | 2/2019 | Huang | |
| 10,784,872 B1* | 9/2020 | Tsai | H03L 7/087 |
| 10,895,850 B1* | 1/2021 | Elkholy | G04F 10/005 |
| 10,931,291 B1* | 2/2021 | Patnaik | H03L 7/093 |
| 11,387,833 B1* | 7/2022 | Li | H03L 7/0891 |
| 11,545,982 B2* | 1/2023 | Perin | G01S 11/02 |
| 11,569,831 B1* | 1/2023 | Grimaldi | H03L 7/1976 |
| 11,632,116 B2* | 4/2023 | Perrott | H03L 7/1976 |
| | | | 327/156 |
| 11,632,230 B2* | 4/2023 | Li | H03L 7/081 |
| | | | 327/147 |
| 2009/0278611 A1* | 11/2009 | Cloutier | H03C 3/0933 |
| | | | 331/4 |
| 2010/0207693 A1* | 8/2010 | Fagg | H03L 7/1976 |
| | | | 331/10 |
| 2016/0211967 A1* | 7/2016 | Huang | H03C 3/0933 |
| 2017/0366376 A1 | 12/2017 | Wang et al. | |
| 2019/0214976 A1* | 7/2019 | Wu | H03L 7/0805 |
| 2020/0266806 A1* | 8/2020 | Nakajima | H03L 7/1974 |
| 2021/0119618 A1* | 4/2021 | Wei | H03L 7/18 |
| 2022/0190833 A1* | 6/2022 | Moslehi Bajestan | |
| | | | H03L 7/1976 |
| 2022/0191001 A1* | 6/2022 | Poulsen | H04L 7/0331 |
| 2022/0393565 A1* | 12/2022 | Li | H03K 5/131 |

FOREIGN PATENT DOCUMENTS

| | | | | |
|---|---|---|---|---|
| CN | 112953515 A | * | 6/2021 | |
| CN | 114337662 A | * | 4/2022 | |
| EP | 4064568 A1 | * | 9/2022 | H03L 7/085 |
| EP | 4064569 A1 | * | 9/2022 | H03L 7/085 |
| EP | 4080769 A1 | * | 10/2022 | H03L 7/0991 |
| KR | 10-1983090 B1 | | 7/2016 | |
| KR | 102502245 B1 | * | 2/2023 | |
| WO | WO-2016032665 A1 | * | 3/2016 | H03L 7/093 |
| WO | WO-2021164881 A1 | * | 8/2021 | H03L 7/087 |
| WO | WO-2022073617 A1 | * | 4/2022 | |

\* cited by examiner

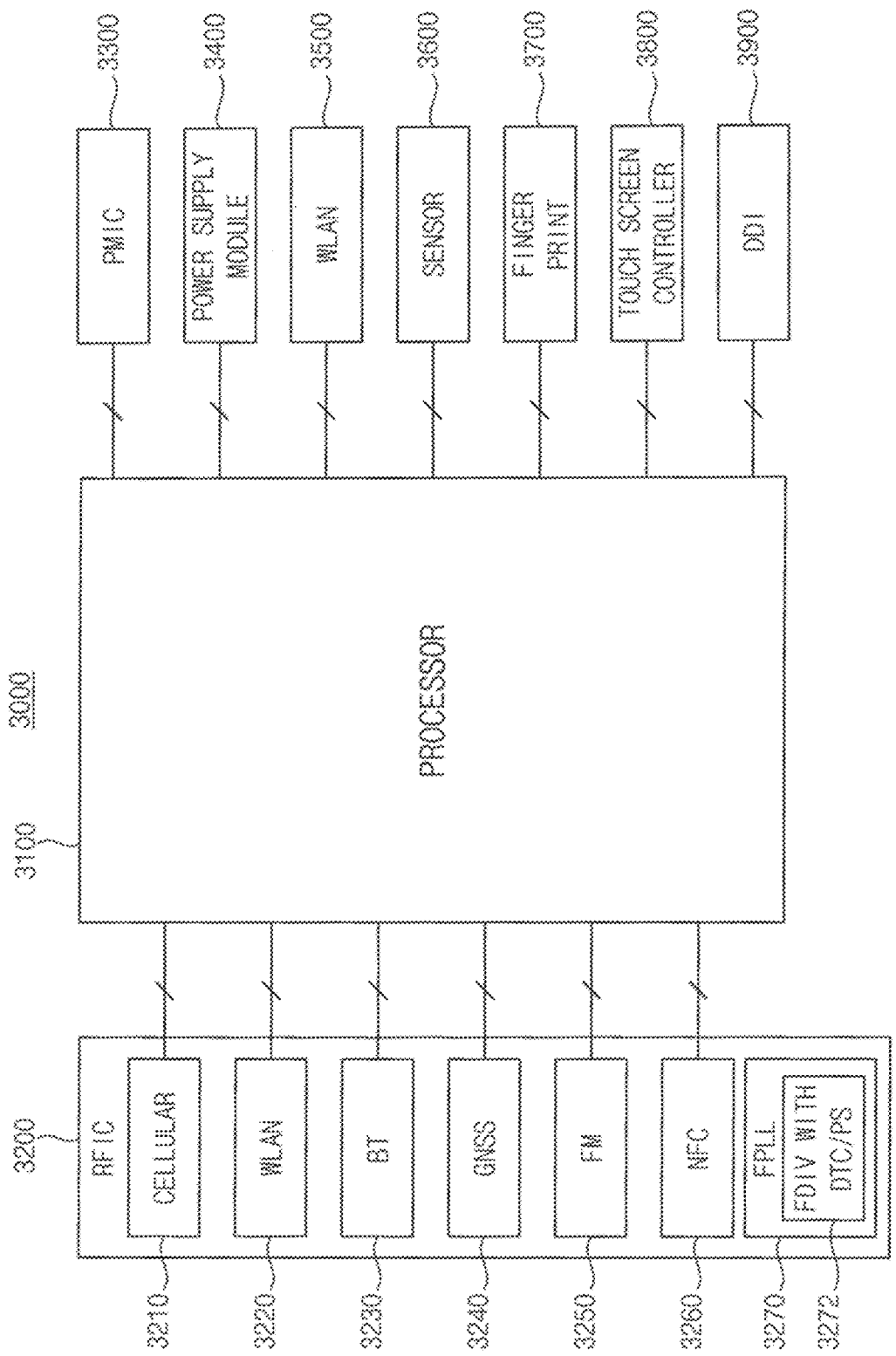

FRACTIONAL DIVIDER WITH PHASE SHIFTER AND FRACTIONAL PHASE LOCKED LOOP INCLUDING THE SAME

CROSS-REFERENCE TO RELATED APPLICATION

This application claims priority under 35 USC § 119 to Korean Patent Application No. 10-2021-0166785 filed on Nov. 29, 2021 in the Korean Intellectual Property Office (KIPO), the contents of which are herein incorporated by reference in their entirety.

BACKGROUND

Various example embodiments relate generally to semiconductor integrated circuits, and more particularly to fractional dividers with phase shifters, and/or fractional phase locked loops including the fractional dividers.

In spite of improvements of speed of peripheral devices, such as memory, communication devices, and/or graphic devices, and a data transmission rate, operating speeds of peripheral devices have not kept up or have not sufficiently kept up with an operating speed of processors, in some cases. Further, a speed difference between new microprocessors and their peripheral devices is often present. Thus, some high performance digital systems have been required or desired to dramatically improve speed of peripheral devices.

For example, as in a data transmission between a memory device and a memory controller, in an input and output method of transmitting data by synchronizing a clock signal, a load of a bus increases and/or a transmission frequency becomes faster. Thus it is very important to temporally synchronize the clock signal and data. To this end, a phase locked loop (PLL) circuit and/or a delay locked loop (DLL) circuit, etc. are used. The PLL and the DLL are used in a variety of application circuits.

SUMMARY

At least some example embodiments provides a fractional divider including a digital-to-time converter (DTC) and capable of reducing a dynamic range of the digital-to-time converter, power consumption and/or circuit area using a phase shifter.

Alternatively or additionally, at least some example embodiments.

According to various example embodiments, a fractional divider includes an integer divider, a delta-sigma modulator, a phase shifter, a quantization noise canceller, and a digital-to-time converter. The integer divider is configured to receive one of a plurality of clock signals as an input clock signal, and to generate a first division clock signal based on the input clock signal and a first control signal. Phases of the plurality of clock signals partially overlap each other. The delta-sigma modulator is configured to generate a delta-sigma modulation signal based on the first division clock signal and a frequency control word. The phase shifter is configured to generate a second division clock signal based on the plurality of clock signals, the first division clock signal and a second control signal. The second control signal corresponds to a quantization noise of the delta-sigma modulator. The quantization noise canceller is configured to generate the second control signal and a digital control word based on the quantization noise of the delta-sigma modulator. The digital-to-time converter is configured to generate a final division clock signal based on the second division clock signal and the digital control word.

According to various example embodiments, a fractional phase locked loop includes a phase frequency detector, a loop filter, a multi-phase voltage controlled oscillator and a fractional divider. The phase frequency detector is configured to generate a phase detection signal based on a reference clock signal and a feedback clock signal. The loop filter is configured to generate an output control signal based on the phase detection signal. The multi-phase voltage controlled oscillator is configured to generate a plurality of clock signals based on the output control signal, and to output one of the plurality of clock signals as an output clock signal. Phases of the plurality of clock signals partially overlap each other. The fractional divider generates the feedback clock signal by dividing the output clock signal. The fractional divider includes an integer divider, a delta-sigma modulator, a phase shifter, a quantization noise canceller, and a digital-to-tire converter. The integer divider is configured to generate a first division clock signal based on the output clock signal and a first control signal. The delta-sigma modulator is configured to generate a delta-sigma modulation signal based on the first division clock signal and a frequency control word. The phase shifter is configured to generate a second division clock signal based on the plurality of clock signals, the first division clock signal and a second control signal. The second control signal corresponds to a quantization noise of the delta-sigma modulator. The quantization noise canceller is configured to generate the second control signal and a digital control word based on the phase detection signal and the quantization noise of the delta-sigma modulator. The digital-to-time converter is configured to generate the feedback clock signal based on the second division clock signal and the digital control word.

According to various example embodiments, a fractional divider includes an integer divider, a delta-sigma modulator, a first adder, a phase shifter, a second adder, a quantization noise canceller, and a digital-to-time converter. The integer divider is configured to receive one of a plurality of clock signals as an input clock signal, and to generate a first division clock signal based on the input clock signal and a first control signal. Phases of the plurality of clock signals partially overlap each other. The first division clock signal is obtained by an integer-division of the input clock signal. The delta-sigma modulator is configured to generate a delta-sigma modulation signal based on the first division clock signal and a frequency control word. The frequency control word includes an integer part and a fractional part. The first adder is configured to generate the first control signal by adding the integer part of the frequency control word and the delta-sigma modulation signal. The phase shifter is configured to generate a second division clock signal based on the plurality of clock signals, the first division clock signal, and a second control signal. The second control signal corresponds to a first portion of a quantization error signal corresponding to a quantization noise of the delta-sigma modulator. The second division clock signal is obtained by a fractional-division of the input clock signal. The second adder is configured to generate a difference signal by subtracting the delta-sigma modulation signal from the fractional part of the frequency control word. The quantization noise canceller is configured to generate the quantization error signal by integrating the difference signal, and to generate the second control signal and a digital control word based on a third control signal. The third control signal corresponds to a second portion of the quantization error signal different from the first portion of the quantization error signal. The digital-to-time converter is configured to generate a final division clock signal based on the second division clock signal and the digital control word. The final division clock signal is obtained by a fractional-division of the input clock signal. The final division clock signal is generated by adding a time delay to the first division clock signal. The time delay corresponds to the quantization noise of the delta-sigma modulator, and includes a coarse time delay and a fine time delay. In response to the time delay being represented as a digital value including (M+K) bits, where each of M and K is a natural number, the phase shifter is configured to generate the course time delay corresponding to upper M bits among the (M+K) bits, and the digital-to-time converter is configured to generate the fine time delay corresponding to lower K bits among the (M+K) bits.

The fractional divider according to some example embodiments may include the phase shifter that operates based on the multi-phase clock signal. The final division clock signal by which the input clock signal is fractionally divided may be generated using the integer divider and the delta-sigma modulator, and the time delay for canceling or removing the quantization noise of the delta-sigma modulator may be generated using the phase shifter and the digital-to-time converter. Alternatively or additionally, the phase shifter may generate the coarse time delay by performing the coarse digital-to-time conversion, and the digital-to-time converter may generate the fine time delay by performing the fine digital-to-time conversion. For example, the course digital-to-time conversion may be performed using the phase shifter that is smaller in size and has less power consumption than the digital-to-time converter. Accordingly, the dynamic range of the digital-to-time converter may be reduced, and the fractional divider and the fractional phase locked loop including the fractional divider may have reduced power consumption and size.

BRIEF DESCRIPTION OF THE DRAWINGS

Illustrative, non-limiting example embodiments will be more clearly understood from the following detailed description taken in conjunction with the accompanying drawings.

FIG. 16 is a block diagram illustrating a digital processing system including a fractional phase locked loop according to some example embodiments.

DETAILED DESCRIPTION OF VARIOUS EXAMPLE EMBODIMENTS

Figure 1:
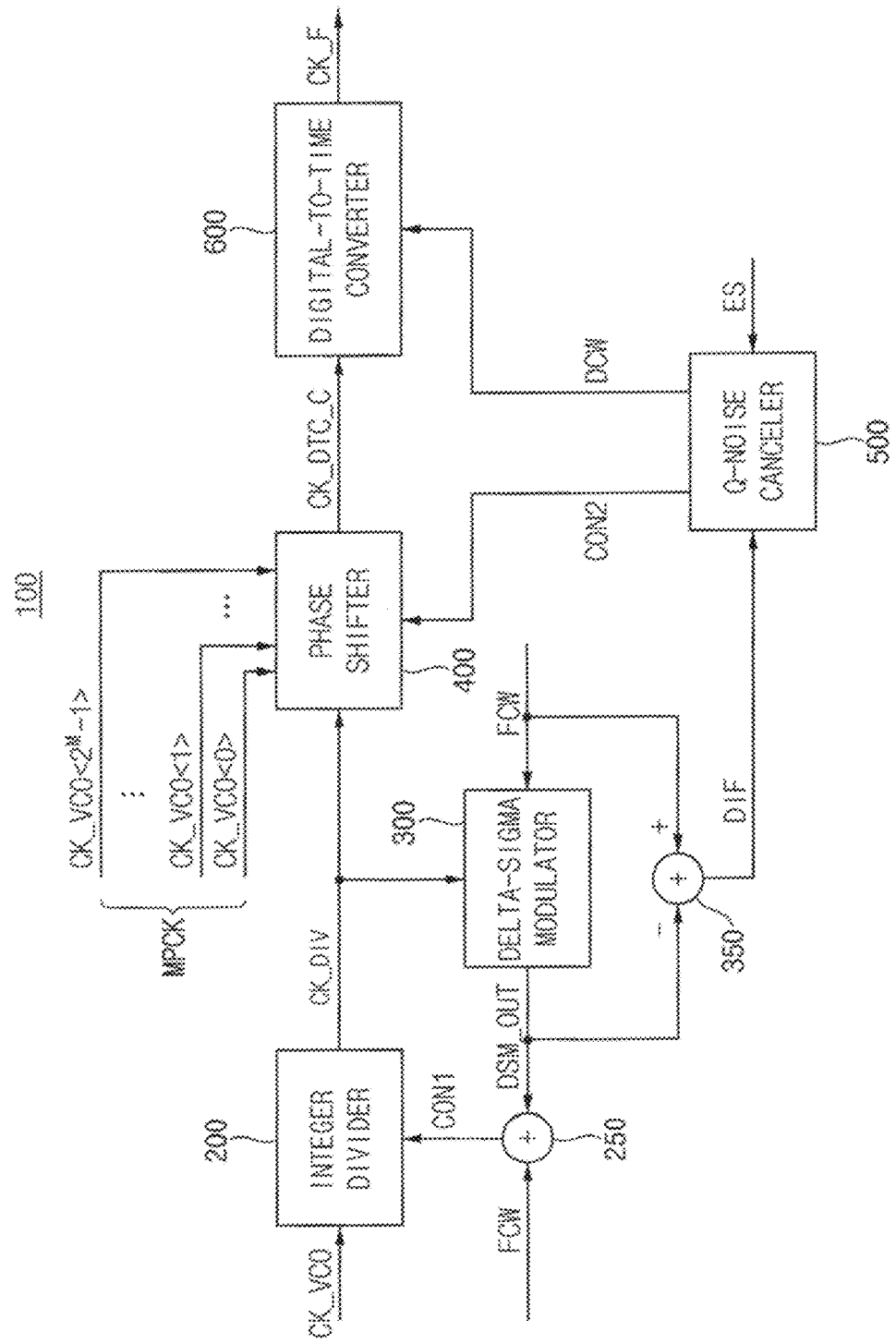
FIG. 1 is a block diagram illustrating a fractional divider according to some example embodiments.

Various example embodiments will be described more fully with reference to the accompanying drawings, in which embodiments are shown. Inventive concepts may, however, be embodied in many different forms and should not be construed as limited to the embodiments set forth herein. Like reference numerals refer to like elements throughout this application.

FIG. 1 is a block diagram illustrating a fractional divider according to some example embodiments.

Referring to FIG. 1, a fractional (or fractional-N) divider 100 includes an integer (or integer-N) divider 200, a delta-sigma modulator (DSM) 300, a phase shifter (PS) 400, a C) quantization noise (Q-noise) canceller 500 and a digital-to-time converter (DTC) 600. The fractional divider 100 may further include a first adder 250 and a second adder 350.

In some example embodiments, the fractional divider 100 may be included in or be integrated with a fractional (or fractional-N) phase locked loop (PLL). An integer (or integer-N) phase locked loop may generate, or only generate an output clock signal having an output frequency that is an integer multiple of the input frequency of an input clock signal. In contrast, the fractional phase locked loop may generate an output clock signal having an output frequency of a real number multiple (or factional multiple) of an input frequency of an input clock signal. The fractional divider 100 may be one of major components of the fractional phase locked loop, and may play a role for generating the output frequency that is or is close to a real multiple of the input frequency. A detailed configuration of the fractional phase locked loop including the fractional divider 100 will be described with reference to FIGS. 11, 12 and 13.

The integer divider 200 receives one of a plurality of clock signals CK_VCO<0>, CK_VCO<1>, . . . , CK_VCO<$2^M$−1> as an input clock signal CK_VCO, and generates a first division clock signal CK_DIV based on the input clock signal CK_VCO and a first control signal CON1. Phases of the plurality of clock signals CK_VCO<0> to CK_VCO<$2^M$−1> at least partially overlap each other. The first division clock signal CK_DIV may be or may include a signal obtained by an integer-division of the input clock signal CK_VCO. The first control signal CON1 may represent a division ratio (e.g., an integer) of the integer divider 200. For example, the first control signal CON1 may represent a value obtained by dividing a frequency of the input clock signal CK_VCO by a frequency of the first division clock signal CK_DIV. The plurality of clock signals CK_VCO<0> to CK_VCO<$2^M$−1> may be referred to as a multi-phase clock signal MPCK.

In some example embodiments, the plurality of clock signals CK_VCO<10> to CK_VCO<2-1> and the input clock signal CK_VCO may be provided from the fractional phase locked loop including the fractional divider 100. For example, the fractional phase locked loop may include a multi-phase voltage controlled oscillator (VCO) and/or multi-phase digitally controlled oscillator (DCO) that generates the plurality of clock signals CK_VCO<0> to CK_VCO<$2^M$–1>, and may output one of the plurality of clock signals CK_VCO<0> to CK_VCO<$2^M$–1> as an output clock signal (e.g., an output clock signal CK_FOUT in FIG. 11). The input clock signal CK_VCO may correspond to the output clock signal that is an output of the fractional phase locked loop.

In some example embodiments, the plurality of clock signals CK_VCO<0> up to CK_VCO<$2^M$–1> may include a first clock signal CK_VCO<0> up to a $2^M$-th clock signal CK_VCO<$2^M$–1>, where M is a natural number. For example, when an M-bit multi-phase digitally controlled oscillator is used, clock signals having $2^M$ different phases with the same period may be obtained.

Figure 2:
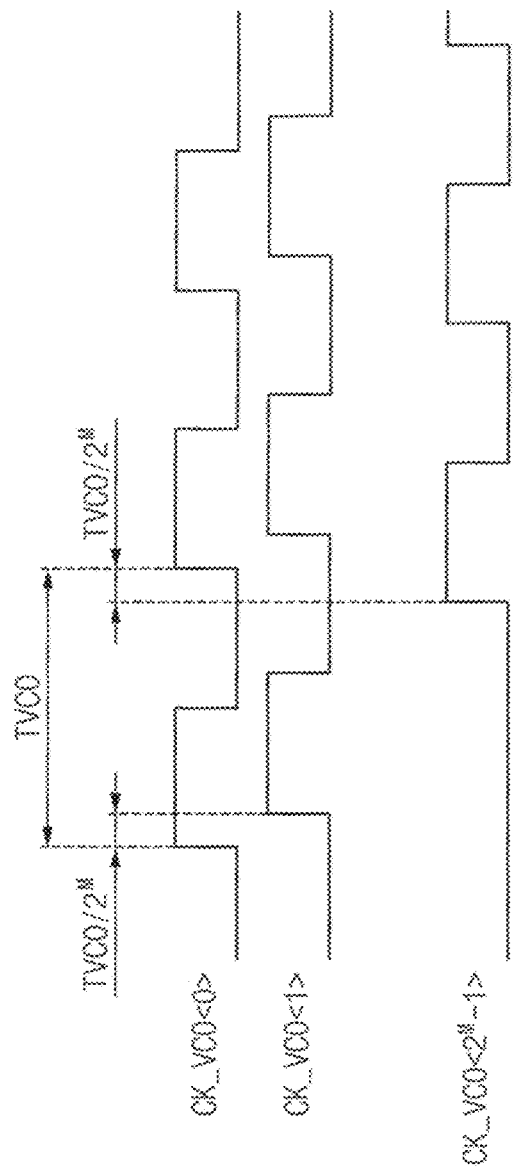
FIG. 2 is a diagram for describing a plurality of clock signals used in a fractional divider according to some example embodiments.

FIG. 2 is a diagram for describing a plurality of clock signals used in a fractional divider according to some example embodiments.

Referring to FIG. 2, the first to $2^M$-th clock signals CK_VCO<0> to CK_VCO<$2^M$–1> may have the same period (e.g., a first period TVCO). The first to $2^M$-th clock signals CK_VCO<0> to CK_VCO<$2^M$–1> may have the same, or different, duty cycles; for example, the duty cycle of each of the first to $2^M$-th clock signals CK_VCO<0> to CK_VCO<$2^M$–1> may be 50%. A phase difference between two adjacent clock signals among the first to $2^M$-th clock signals CK_VCO<0> to CK_VCO<$2^M$–1> may correspond to a value obtained by dividing the first period by $2^M$. For example, a phase difference between the first and second clock signals C K_VCO<0> and CK_VCO<1> that are adjacent to each other may correspond to TVCO/$2^M$. For example, when M=3, the phase difference between the first and second clock signals CK_VCO<0> and CK_VCO<1> may correspond to TVCO/8. For example, a phase difference between the first and $2^M$-th clock signals CK_VCO<0> and CK_VCO<$2^M$–1> may correspond to ($2^M$–1)*TVCO/$2^M$, and a phase difference between a first rising edge of the $2^M$-th clock signal CK_VCO<$2^M$–1> and a second rising edge of the first clock signal CK_VCO<0> may correspond to TVCO/$2^M$.

Referring again to FIG. 1, the delta-sigma modulator 300 generates a delta-sigma modulation signal DSM_OUT based on the first division clock signal CK_DIV and on a frequency control command or frequency control word FCW. The first division clock signal CK_DIV may be used as a driving clock of the delta-sigma modulator 300. The frequency control word FCW may represent a division ratio (e.g., a real number such as a rational number, such as a ratio of two integers or an irrational number or a rational number that is close to a real number) of the fractional divider 100. For example, the frequency control word FCW may represent a value obtained by dividing the frequency of the input clock signal CK_VCO by a frequency of a final division clock signal CK_F.

The first adder 250 may generate the first control signal CON1 by adding the frequency control word FCW and the delta-sigma modulation signal DSM_OUT. The second adder 350 may generate a difference signal DIF by subtracting the delta-sigma modulation signal DSM_OUT from the frequency control word FCW.

As described above, the frequency control word FCW may be a real number such as a ratio of two whole numbers, and thus may include an integer part and a fractional part. For example, as will be described with reference to FIG. 3, the frequency control word FCW input to the delta-sigma modulator 300 and to the second adder 350 may corresponds to the fractional part, and the frequency control word FCW input to the first adder 250 may correspond to the integer part.

The delta-sigma modulator 300 may serve to dither the fractional part of the frequency control word FCW. For example, when the frequency control word FCW is 2.5, the integer part and the fractional part may be 2 and 0.5, respectively, and the delta-sigma modulator 300 may generate the delta-sigma modulation signal DSM_OUT such that the fractional part (e.g., 0.5) is represented as a signal in which 0 and 1 are repeated, e.g. are repeated periodically one after another as in 0-1-0-1 . . . or 1-0-1-0 . . . .

In addition, the first control signal CON1 input to the integer divider 200 may have a value obtained by adding the integer part of the frequency control word FCW and the delta-sigma modulation signal DSM_OUT. For example, when the frequency control word FCW is 2.5 as described above, the input clock signal CK_VCO may be divided by a division ratio dithered by 2 and 3. In this example, an instantaneous frequency of the first division clock signal CK_DIV that is an output of the integer divider 200 may be or may correspond to a value obtained by dividing the frequency of the input clock signal CK_VCO by 2 or 3. However, by a bandwidth of the fractional phase locked loop including the fractional divider 100, a final output frequency (e.g., the frequency of the final division clock signal CK_F) may be obtained by dividing the frequency of the input clock signal CK_VCO by 2.5, which is an average value of 2 and 3.

The phase shifter 400 generates a second division clock signal CK_DTC_C based on the plurality of clock signals CK_VCO<0> to CK_VCO<$2^M$–1>, the first division clock signal CK_DIV and a second control signal CON2. The second control signal CON2 corresponds to a quantization noise of the delta-sigma modulator 300. The second division clock signal CK_DTC_C may be or may correspond to a signal obtained by a fractional-division of the input clock signal CK_VCO.

The quantization noise canceller 500 generates the second control signal CON2 and a digital control word DCW based on the quantization noise of the delta-sigma modulator 300. For example, the quantization noise canceller 500 may generate a quantization error signal based on the difference signal DIF, and may generate the second control signal CON2 and the digital control word DCW based on the quantization error signal. The quantization error signal may correspond to the quantization noise of the delta-sigma modulator 300. For example, the second control signal CON2 may correspond to a portion of the quantization error signal.

Detailed configurations of the phase shifter 400 and the quantization noise canceller 500 will be described with reference to FIGS. 3 and 7.

In some example embodiments, a phase detection signal (or phase error signal) ES may be used by the quantization noise canceller 500 to generate the digital control word DCW. The phase detection signal ES may be provided from the fractional phase locked loop including the fractional divider 100. For example, the fractional phase locked loop may include a phase frequency detector (PFD) and/or a time-to-digital converter (TDC) that generates the phase detection signal ES based on a reference clock signal (e.g. a reference clock signal CK_REF in FIG. 11) and a feedback clock signal (e.g., a feedback clock signal CK_FB in FIG. 11). The feedback clock signal may correspond to the final division clock signal CK_F that is an output of the fractional divider 100.

The digital-to-time converter 600 generates the final division clock signal CK_F based on the second division clock signal CK_DTC_C and the digital control word DCW. The final division clock signal CK_F may be a signal obtained by a fractional-division of the input clock signal CK_VCO. The final division clock signal CK_F may be the feedback clock signal that is input to the fractional phase locked loop including the fractional divider 100. The digital control word DCW may be referred to as a delay control word.

In some example embodiments, the final division clock signal CK_F may be generated by adding a time delay to the first division clock signal CK_DIV. The time delay may correspond to the quantization noise of the delta-sigma modulator 300, and may include a coarse time delay and a fine time delay. For example, the phase shifter 400 may generate the coarse time delay, and the digital-to-time converter 600 may generate the fine time delay, which will be described with reference to FIGS. 5 and 9.

As described above, even though the final output frequency obtained by dividing the frequency of the input clock signal CK_VCO by a real number (such as an irrational number or a ratio of two whole numbers) is generated using the integer divider 200 and the delta-sigma modulator 300, an instantaneous error, which is an instantaneous difference between the frequency of the first division clock signal CK_DIV that is the output of the integer divider 200 and the final output frequency, may cause degradation and/or deterioration of out-band phase noise of the fractional phase locked loop including the fractional divider 100. The instantaneous error may be referred to as a quantization error and/or quantization noise.

To reduce the quantization noise of the delta-sigma modulator 300, the digital-to-time converter 600 may be used. For example, the final division clock signal CK_F may be generated, using the digital-to-time converter 600, by directly adding or subtracting the time delay corresponding to the instantaneous error to/from the first division clock signal CK_DIV that is the output of the integer divider 200. When the difference signal DIF that is a difference between the frequency control word FCW and the delta-sigma modulation signal DSM_OUT is used, the quantization noise occurring on the first division clock signal CK_DIV that is the output of the integer divider 200 may be predicted or more accurately predicted. Alternatively or additionally, when a gain of the digital-time converter 600 is calibrated or compensated using the quantization noise canceller 500, the quantization noise may be canceled or reduced by adding the time delay corresponding to the instantaneous error in the opposite direction.

If there is no or a small amount of quantization noise cancellation using the digital-to-time converter 600, the quantization noise may be included in a phase error as it is, and may be converted via a phase frequency detector and/or a time-to-digital converter included in a fractional phase locked loop. The quantization noise may have a relatively large deviation as compared with a random noise. Thus, the phase frequency detector and/or the time-to-digital converter may have a relatively wide dynamic range to completely convert the phase error including the quantization noise, and there may be a design burden for the phase frequency detector and/or for the time-to-digital converter.

In contrast, if there is the quantization noise cancellation using the digital-to-time converter 600, e.g., when the digital-to-time converter-based (DTC-based) fractional divider 100 including the digital-to-time converter 600 is used, the quantization noise may be at least partially canceled, reduced, or removed from the phase error. Thus, a dynamic range of the phase frequency detector or the time-to-digital converter included in the fractional phase locked loop may be reduced. Alternatively or additionally, the phase frequency detector or the time-to-digital converter having relatively low power consumption and high linearity may be used.

For example, the digital-to-time converter 600 may be used to reduce the design burden of the phase frequency detector or the time-to-digital converter included in the fractional phase locked loop. The digital-to-time converter 600 may have a low design burden as compared with the time-to-digital converter that includes as many flip-flop as the number of bits, and thus it may be advantageous to use the digital-to-time converter 600. Alternatively or additionally, it may also be advantageous to design the fractional phase locked loop with a wider bandwidth to reduce the phase noise of the voltage controlled oscillator or the digitally controlled oscillator by reducing the quantization noise of the out-band phase noise of the fractional phase locked loop.

As described above, although the digital-to-time converter 600 is used to reduce the dynamic range of the phase frequency detector or the time-to-digital converter included in the fractional phase locked loop, a dynamic range of the digital-to-time converter 600 may be determined by the quantization noise of the delta-sigma modulator 300, and a range of the quantization noise of the delta-sigma modulator 300 may be determined by the type and/or the order of the delta-sigma modulator 300 and the output frequency of the output clock signal of the fractional phase locked loop. For example, as the dynamic range of the digital-to-time converter 600 increases, the linearity may be degraded and the power consumption may increase. Therefore, it is necessary or desirable to reduce the dynamic range of the digital-to-time converter 600.

The fractional divider 100 according to some example embodiments may include the phase shifter 400 that operates based on the multi-phase clock signal MPCK. The final division clock signal CK_F by which the input clock signal CK_VCO is fractionally divided may be generated using the integer divider 200 and the delta-sigma modulator 300, and the time delay for canceling or removing the quantization noise of the delta-sigma modulator 300 may be generated using the phase shifter 400 and the digital-to-time converter 600. Alternatively or additionally, the phase shifter 400 may generate the coarse time delay by performing the coarse digital-to-time conversion, and the digital-to-time converter 600 may generate the fine time delay by performing the fine digital-to-time conversion. In other words, the course digital-to-time conversion may be performed using the phase shifter 400 that is smaller in size and has less power consumption than the digital-to-time converter 600. Accordingly, the dynamic range of the digital-to-time converter 600 may be reduced, and/or the fractional divider 100 may have reduced power consumption and size.

Figure 3:
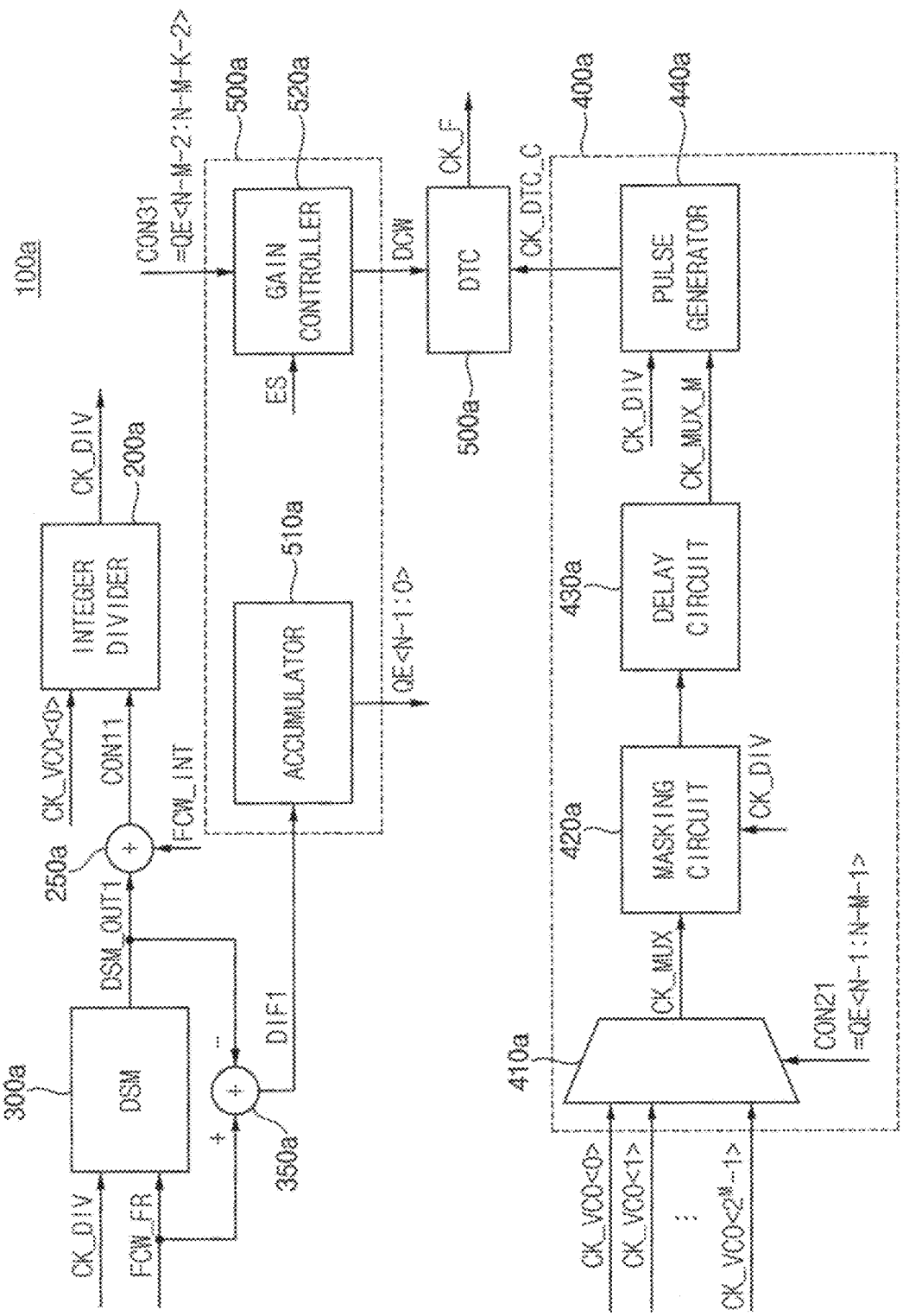
FIG. 3 is a block diagram illustrating an example of a fractional divider of FIG. 1.

FIG. 3 is a block diagram illustrating an example of a fractional divider of FIG. 1.

Referring to FIG. 3, a fractional divider 100a may include an integer divider 200a, a delta-sigma modulator 300a, a phase shifter 400a, a quantization noise canceller 500a, a digital-to-time converter 600a, a first adder 250a and a second adder 350a.

The delta-sigma modulator 300a may generate a delta-sigma modulation signal DSM_OUT1 based on the first division clock signal CK_DIV and a fractional part FCW_FR of the frequency control word FCW. For example, the fractional part FCW_FR of the frequency control word FCW may be expressed as a digital value including N bits, where N is a natural number.

In some example embodiments, the delta-sigma modulator 300a may have a multi-stage noise shaping (MASH) structure. The MASH structure may be a commonly used structure of a delta-sigma modulator, and may guarantee a stable operation by employing several individual modulators. For example, the delta-sigma modulator 300a may be a MASH 1 type delta-sigma modulator and the delta-sigma modulation signal DSM_OUT1 may be a 1-bit digital signal. Since the MASH 1 type delta-sigma modulator is well known to those skilled in the art, a detailed description thereof will be omitted.

The first adder 250a may generate a first control signal CON11 by adding an integer part FCW_INT of the frequency control word FCW and the delta-sigma modulation signal DSM_OUT1. The integer divider 200a may receive the first clock signal CK_VCO<0> among the plurality of clock signals CK_VCO<0> to CK_VCO<$2^M-1$> as the input clock signal CK_VCO, and may generate the first division clock signal CK_DIV based on the first clock signal CK_VCO<0> and the first control signal CON11.

The second adder 350a may generate a difference signal DIF1 by subtracting the delta-sigma modulation signal DSM_OUT1 from the fractional part FCW_FR of the frequency control word FCW. For example, as with the fractional part FCW_FR of the frequency control word FCW, the difference signal DIF1 may be expressed as a digital value including N bits.

The quantization noise canceller 500a may generate a quantization error signal QE<N−1:0> based on the difference signal DIF1, may generate a second control signal CON21 and a third control signal CON31 that correspond to the quantization error signal QE<N−1:0>, and may generate the digital control word DCW based on the third control signal CON31. The quantization noise canceller 500a may include an accumulator 510a and a gain controller 520a.

The accumulator 510a may generate the quantization error signal QE<N−1:0> based on the difference signal DIF1. The quantization error signal QE<N−1:0> may represent or correspond to a quantization noise of the delta-sigma modulator 300a, and there may be a correlation between the quantization error signal QE<N−1:0> and the quantization noise of the delta-sigma modulator 300a. For example, the quantization error signal QE<N−1:0> may be generated by integrating or accumulating the difference signal DIF1 that represents or corresponds to a difference between the fractional part FCW_FR of the frequency control word FCW and the delta-sigma modulation signal DSM_OUT1. For example, as with the difference signal DIF1, the quantization error signal QE<N−1:0> may be expressed as a digital value including N bits.

In some example embodiments, each of the second control signal CON21 and the third control signal CON31 may correspond to a portion of the quantization error signal QE<N−1:0>. For example, the second control signal CON21 may correspond to a first portion QE<N−1:N−M−1> of the quantization error signal QE<N−1:0>, and the third control signal CON31 may correspond to a second portion QE<N−M−2:N−M−K−2> of the quantization error signal QE<N−1:0> that is different from the first portion QE<N−1:N−M−1> of the quantization error signal QE<N−1:0>.

Figure 4:
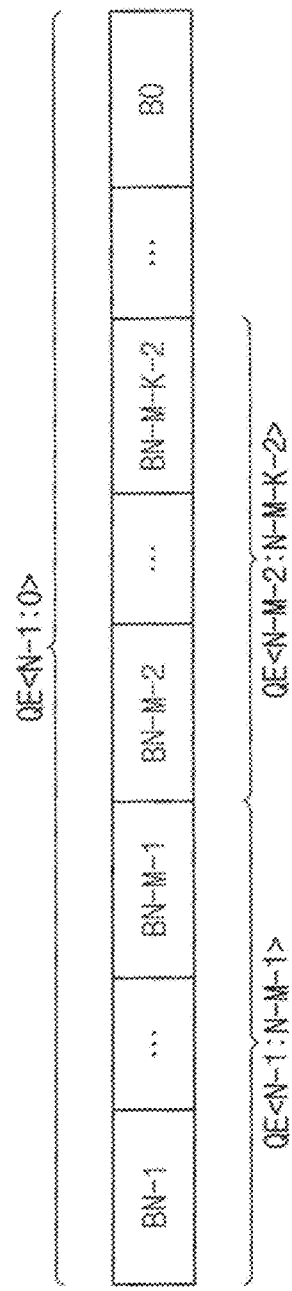
FIG. 4 is a diagram for describing a quantization error signal that is generated by an accumulator included in a fractional divider of FIG. 3.

FIG. 4 is a diagram for describing a quantization error signal that is generated by an accumulator included in a fractional divider of FIG. 3.

Referring to FIG. 4, the quantization error signal QE<N−1:0> may be expressed as a digital value including N bits BN−1, . . . , BN−M−1, BN−M−2, . . . , BN−M−K−2, . . . , B0. For example, the bit BN−1 may be a most significant bit (MSB) of the quantization error signal QE<N−1:0>, and the bit B0 may be a least significant bit (LSB) of the quantization error signal QE<N−1:0>.

The second control signal CON21 in FIG. 3, e.g., the first portion QE<N−1:N−M−1> of the quantization error signal QE<N−1:0>, may include (M+1) bits BN−1 to BN−M−1 among the N bits BN−1 to B, where M is a natural number. For example, the upper (M+1) bits BN−1 to BN−M−1 including the MSB (e.g., the bit BN−1) of the quantization error signal QE<N−1:0> may correspond to the second control signal CON21.

The third control signal CON3i in FIG. 3, e.g., the second portion QE<N−M−2:N−1−K−2> of the quantization error signal QE<N−1:0>, may include (K+1) bits BN−M−2 to BN−M−K−2 among the N bits BN−1 to B0, where M is a natural number. The (K+1) bits BN−M−2 to BN−M−K−2 may be different from the (M+1) bits BN−1 to BN−M−1. For example, the (K+1) bits BN−M−2 to BN−M−K−2 immediately following the upper (M+1) bits BN−1 to BN−M−1 of the quantization error signal QE<N−1:0> may correspond to the third control signal CON31.

In some example embodiments, the number N corresponding to the number of bits of the quantization error signal QE<N−1:0> may be greater than a value obtained by adding the number M corresponding to the number of bits of the second control signal CON21 and the number K corresponding to the number of bits of the third control signal CON31 (e.g., N>(M+K)).

Referring again to FIG. 3, the gain controller 520a may generate the digital control word DCW based on the third control signal CON31 and the phase detection signal ES. For example, as described above, the third control signal CON31 may correspond to the second portion QE<N−M−2:N−M−K−2> of the quantization error signal QE<N−1:0> and may include the (K−1) bits (e.g., the bits BN−M−2 to BN−M−K−2 in FIG. 4). The gain controller 520a may perform the K-bit gain correction.

The phase shifter 400a may generate the second division clock signal CK_DTC_C based on the plurality of clock signals CK_VCO<0> to CK_VCO<$2^M-1$>, the first division clock signal CK_DIV and the second control signal CON21. The phase shifter 400a may include a multiplexer 410a, a masking circuit 420a, a delay circuit 430a and a pulse generator 440a.

The multiplexer 410a may select one of the plurality of clock signals CK_VCO<0> to CK_VCO<$2^M-1$> based on the second control signal CON21. For example, as described above, the second control signal CON21 may correspond to the first portion QE<N−1:N−M−1> of the quantization error signal QE<N−1:0> and may include the (M+1) bits (e.g., BN−1 to BN−M−1 in FIG. 4). For example, the first portion QE<N−1:N−M−1> of the quantization error signal QE<N−1:0> may be an unsigned signal. A signal selected by the multiplexer 410a may be output as a first selection clock signal CK_MUX.

The masking circuit 420a may mask the first selection clock signal CK_MUX based on the first division clock signal CK_DIV. The first division clock signal CK_DIV may be served or used as a driving clock of the masking circuit 420a. The delay circuit 430a may generate a second selection clock signal CK_MUX_M by delaying an output of the masking circuit 420a. For example, the second selection clock signal CK_MUX_M may be generated by synchronizing the first selection clock signal CK_MUX with the first division clock signal CK_DIV and by masking the first selection clock signal CK_MUX for a predetermined time interval.

The pulse generator 440a may generate the second division clock signal CK_DTC_C based on the first division clock signal CK_DIV and the second selection clock signal CK_MUX_M. The second selection clock signal CK_MUX_M may be served or used as a driving clock of the pulse generator 440a. For example, the second division clock signal CK_DTC_C may be generated by sampling the second selection clock signal CK_MUX_M after a predetermined delay from a rising edge of the first division clock signal CK_DIV. For example, the second division clock signal CK_DTC_C may always have a constant offset delay with respect to the rising edge of the first division clock signal CK_DIV, and a delay may be additionally added to the second division clock signal CK_DTC_C by a difference from the selected clock signal at every instantaneous time (e.g., a difference from the first selection clock signal CK_MUX). For example, a value of the constant offset delay may be set to be greater than a minimum value of the time delay generated based on the quantization error signal QE<N−1:0>. For example, the second division clock signal CK_DTC_C may include pulses generated by the pulse generator 440a, widths of the pulses included in the second division clock signal CK_DTC_C may be substantially the same as widths of pulses included in the first and second selection clock signals CK_MUX and CK_MUX_M, and thus a duty ratio of the second division clock signal CK_DTC_C may not be about 50:50.

The digital-to-time converter 600a may generate the final division clock signal CK_F based on the second division clock signal CK_DTC_C and the digital control word DCW. For example, a duty ratio of the final division clock signal CK_F may be about 50:50.

FIGS. 5A, 5B, 5C and 6 are diagrams for describing an operation of a fractional divider of FIG. 3.

Figure 5A:
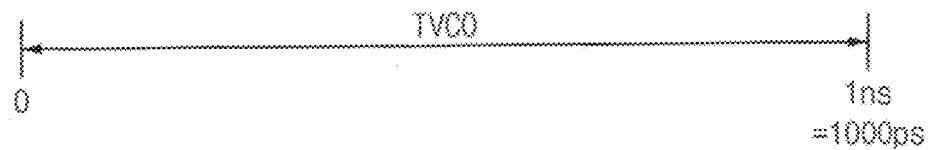
FIGS. 5A, 5B, 5C and 6 are diagrams for describing an operation of a fractional divider of FIG. 3.

FIG. 5A illustrates a period TVCO of an input clock signal of a fractional divider (or an output clock signal of a fractional phase locked loop including the fractional divider).

Figure 5B:
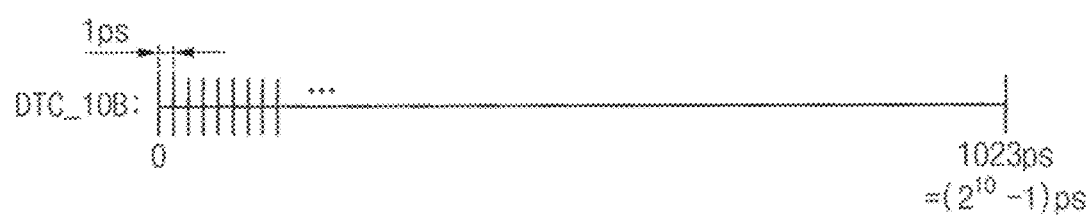
Figure 5C:
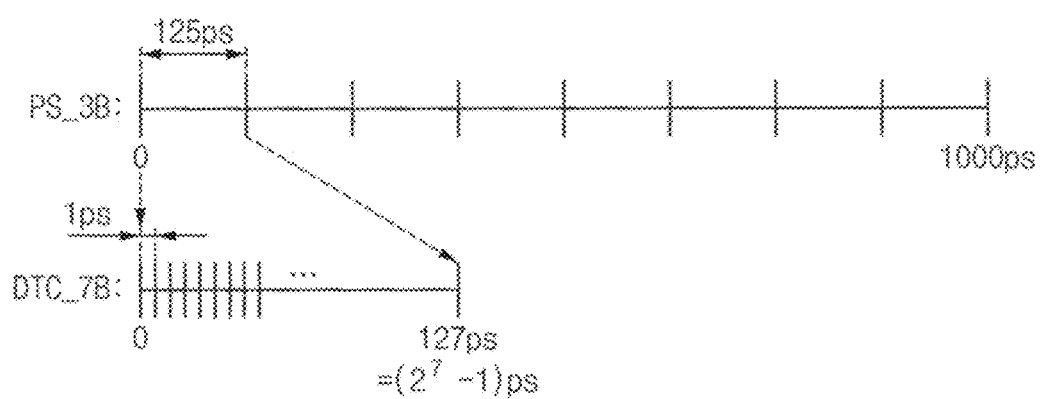

FIG. 5B illustrates a conventional operation in which a conventional fractional divider using only a digital-to-time converter generates a time delay corresponding to a quantization noise of a delta-sigma modulator. FIG. 5C illustrates an operation according to some example embodiments in which the fractional divider 100a using both the phase shifter 400a and the digital-to-time converter 600a together generates the time delay corresponding to the quantization noise of the delta-sigma modulator 300a.

As described with reference to FIG. 1, the dynamic range of the digital-to-time converter may be determined by the quantization noise of the delta-sigma modulator, and the range of the quantization noise of the delta-sigma modulator may be determined by the type of the delta-sigma modulator. For example, in a case of the MASH 1 type delta-sigma modulator described with reference to FIG. 3, the range of the quantization noise may be one period (e.g., 1*TVCO) of the input clock signal of the fractional divider. For another example, in a case of a MASH 1-1 type delta-sigma modulator, the range of the quantization noise may be two periods (e.g., 2*TVCO) of the input clock signal of the fractional divider. Alternatively, in a case of a MASH 1-1-1 type delta-sigma modulator, which will be described with reference to FIG. 7, the range of the quantization noise may be four periods (e.g., 4*TVCO) of the input clock signal of the fractional divider.

To implement the quantization noise cancellation based on the digital-to-time converter (or the DTC-based quantization noise cancellation), the dynamic range of the digital-to-time converter should be designed to be greater than the range of the quantization noise of the delta-sigma modulator. For example, assuming that the resolution and the bit-width of the digital-to-time converter are "Tres" and "n", respectively, where n is a natural number, the dynamic range of the digital-to-time converter may be "$2^n$*Tres". In addition, to reduce the noise of the digital-to-time converter itself, and to operate the phase frequency detector or the time-to-digital converter included in the fractional phase locked loop in a random domain, the resolution (e.g., "Tres") of the digital-to-time converter should be designed to be less than the resolution of the phase frequency detector or the time-to-digital converter.

Referring to FIG. 5A, for convenience of explanation, it is illustrated that the period TVCO of the input clock signal of the fractional divider is about 1 ns (=about 1000 ps). In other words, the frequency of the input clock signal of the fractional divider may be about 1 GHz. As described above, when the delta-sigma modulator is the MASH 1 type delta-sigma modulator, the range of the time delay generated based on the quantization noise of the MASH 1 type delta-sigma modulator (e.g., based on QE<N−1:0> in FIG. 3) may be −0.5*TVCO≤t(QE)≤0.5*TVCO, and thus the dynamic range of the digital-to-time converter should be at least 1*TVCO.

Referring to FIG. 5B, for convenience of explanation, it is illustrated that the resolution of the digital-to-time converter is about 1 ps in the conventional fractional divider using only the digital-to-time converter. In this case, to design the dynamic range of the digital-to-time converter to be greater than 1*TVCO (e.g. greater than about 1000 ps), a 10-bit digital-to-time converter DTC_10B (e.g., the digital-to-time converter with the bit-width of ten) should be used. For example, the dynamic range of the 10-bit digital-to-time converter DTC_10B may be about 1023 ps (=about ($2^{10}$−1)ps).

Referring to FIG. 5C, for convenience of explanation, it is illustrated that M=3 in the fractional divider 100a according to some example embodiments using both the phase shifter 400a and the digital-to-time converter 600a together. In addition, as with the example of FIG. 5B, it is illustrated that the resolution of the digital-to-time converter 600a is about 1 ps in the fractional divider 100a according to some example embodiments using both the phase shifter 400a and the digital-to-time converter 600a together.

In this case, the phase shifter 400a may be implemented as a 3-bit phase shifter PS_3B, may operate as a 3-bit digital-to-time converter with a resolution of about 125 ps, which is TVCO/$2^3$, and may cover the range of the time delay of 1*TVCO (e.g., about 1000 ps) based on the input of QE<N−1:N−4>. Therefore, the dynamic range of the digital-to-time converter 600a may be designed to be greater than about 125 ps, which is TVCO/$2^3$, and a 7-bit digital-to-time converter DTC_7B (e.g., the digital-to-time converter with the bit-width of seven) may be used. For example, the dynamic range of the 7-bit digital-to-time converter DTC_7B may be about 127 ps (=about ($2^7$−1)ps).

As described with reference to FIG. 1, the final division clock signal CK_F may be generated by adding the time delay corresponding to the quantization noise of the delta-sigma modulator 300a to the first division clock signal CK_DIV. In addition, the phase shifter 400*a* may generate the course time delay included the time delay, and the digital-to-time converter 600*a* may generate the fine time delay included the time delay. For example, when the time delay is represented or expressed as a digital value including (M+K) bits, where each of M and K is a natural number, the course time delay may correspond to tipper M bits among the (M+K) bits, and the fine time delay may correspond to lower K bits among the (M+K) bits. When the digital-to-time converter having the same resolution is used in the examples of FIGS. 5B and 5C, the bit-width of the digital-to-time converter included in the conventional fractional divider based on the example of FIG. 5B may be the (M+K) bits, and the bit-width of the digital-to-time converter 600*a* included in the fractional divider 100*a* based on the example of FIG. 5C may be the K bits, which is reduced by M bits as compared with the example of FIG. 5B. For example, FIG. 5C illustrates the example where M=3 and K=7, and the bit-width of the digital-to-time converter may be reduced from ten bits to seven bits by using the 3-bit phase shifter PS_3B.

Figure 6:
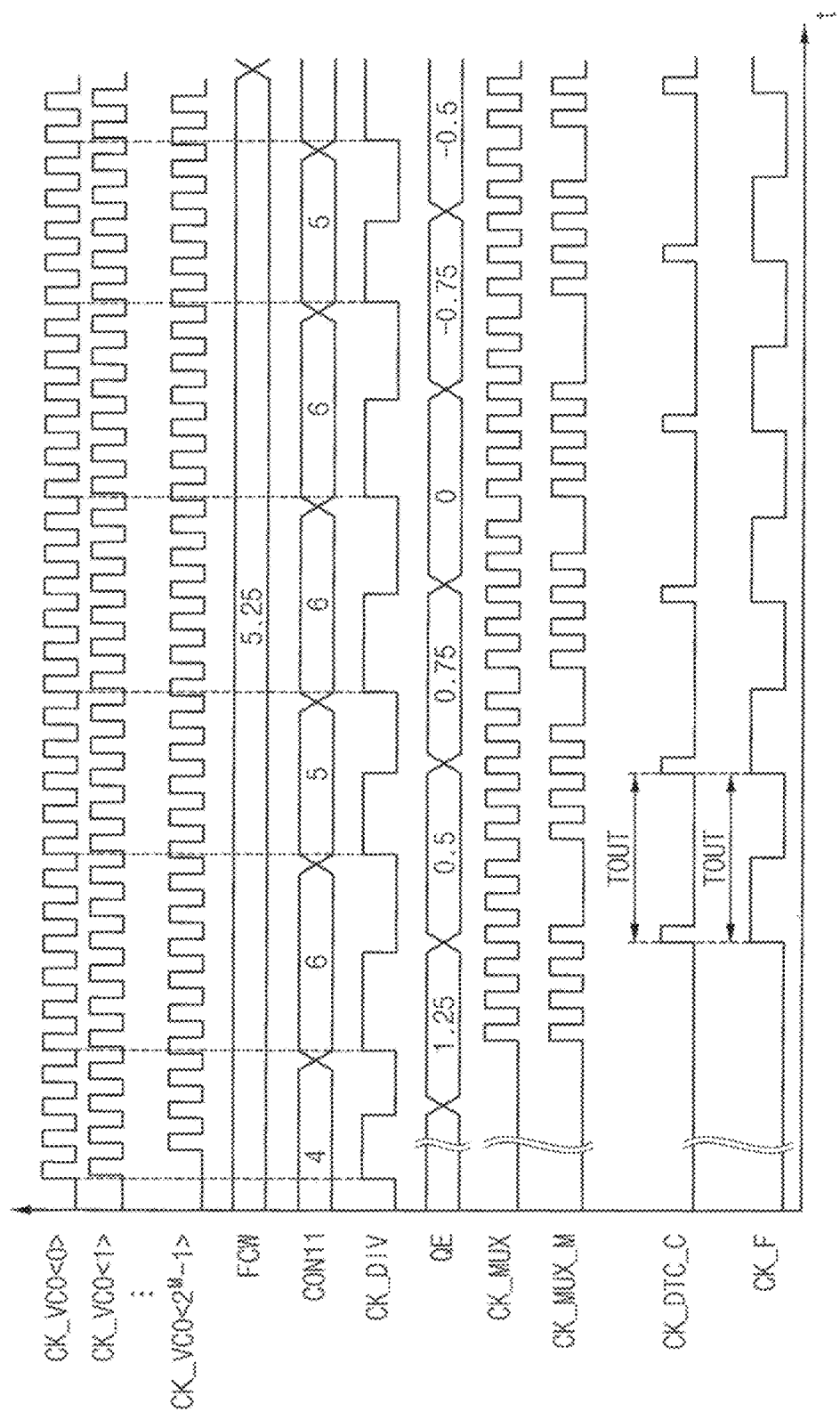

Referring to FIG. 6, a detailed operation timing of the fractional divider 100*a* is illustrated. In an example of FIG. 6, a value of the frequency control word FCW may be 5.25.

For example, the first control signal CON11 that is input to the integer divider 200*a* may have a value that is obtained by adding five, which is the integer part FCW_INT of the frequency control word FCW, to the delta-sigma modulation signal DSM_OUT1, which is dithered by the delta-sigma modulator 300*a*. The first division clock signal CK_DIV may be output in synchronization with the rising edge of the first clock signal CK_VCO<0>. A value of the quantization error signal QE<N−1:0> (for convenience, referred to as QE in FIG. 6) may be calculated in synchronization with the falling edge of the first division clock signal CK_DIV. An initial value of the quantization error signal QE may be zero.

First, when the first control signal CON11 is 4, the value of the quantization error signal QE may be 0+(5.25−4)=1.25. Before the subsequent rising edge of the first division clock signal CK_DIV, the phase shifter 400*a* may generate the time delay based on the value of the quantization error signal QE (e.g., based on quantization noise information). For example, the second selection clock signal CK_MUX_M may be generated by selecting the first selection clock signal CK_MUX and by masking the first selection clock signal CK_MUX for a predetermined time interval. The first selection clock signal CK_MUX may be a signal having a relatively high frequency and thus large power consumption, and thus the first selection clock signal CK_MUX may be masked so as not to be toggled any more after the predetermined time interval required to generate the time delay. The second division clock signal CK_DTC_C may be generated by operating the pulse generator 440*a* based on the second selection clock signal CK_MUX_M, and the final division clock signal CK_F may be generated based on the second division clock signal CK_DTC_C. A period TOUT of the second division clock signal CK_DTC_C and the final division clock signal CK_F may be 5.25*TVCO.

Next, when the first control signal CON11 is 6, the value of the quantization error signal QE may be 0.5 that is obtained by subtracting 0.75 from the previously obtained value 1.25 (e.g., QE=1.25+(5.25−6)=0.5). Thereafter, when the first control signal CON11 is 5, QE=0.5+(5.25−5)=0.75. Thereafter, when the first control signal CON11 is 6, QE=0.75+(5.25−6)=0. Thereafter, when the first control signal CON11 is 6, QE=0+(5.25−6)=−0.75. Thereafter, when the first control signal CON11 is 5, QE=−0.75+(5.25−5)=− 0.5. As with that described above, the first selection clock signal CK_MUX may be selected in every (or each) cycle, and the second selection clock signal CR_MUX_M, the second division clock signal CK_DTC_C and the final division clock signal CK_F may be generated in every (or each) cycle. In addition, the value of the quantization error signal QE may vary or may be changed every cycle, and the time delay added to the first division clock signal CK_DIV may be changed depending on the quantization error signal QE.

In the example of FIG. 6 where FCW=5.25, the fractional part FCW_FR of the frequency control word FCW may be relatively simply expressed as 0.25, so that the fine digital-to-time conversion by the digital-to-time converter 600*a* may not be performed and may be omitted. However, example embodiments are not limited thereto, and when the fractional part FCW_FR of the frequency control word FCW is relatively complicatedly expressed, the time delay may be represented or expressed in more detail by using the digital-to-time converter 600*a*.

Figure 7:
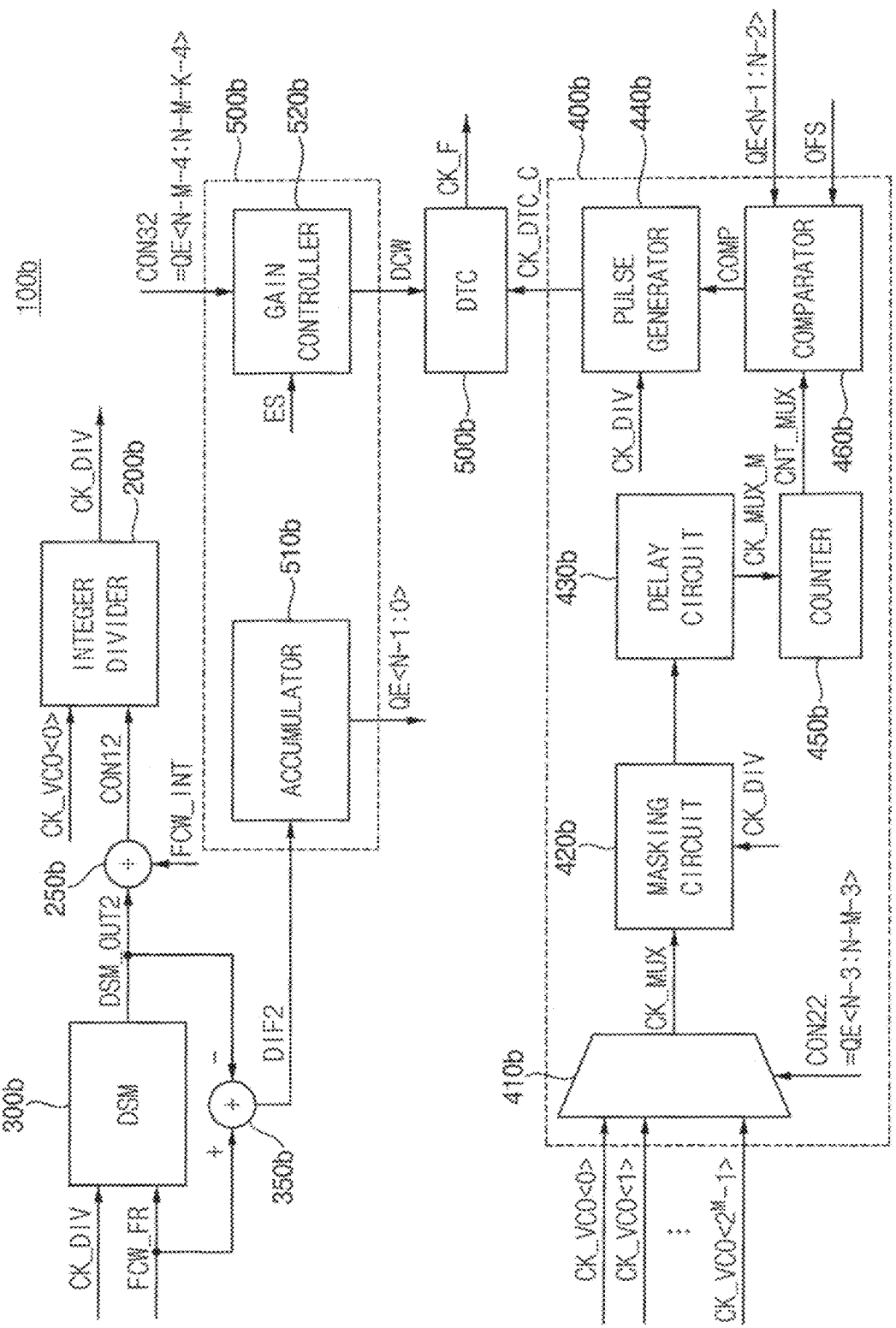
FIG. 7 is a block diagram illustrating another example of a fractional divider of FIG. 1.

FIG. 7 is a block diagram illustrating another example of a fractional divider of FIG. 1. The descriptions repeated with FIG. 3 will be omitted.

Referring to FIG. 7, a fractional divider 100*b* may include an integer divider 200*b*, a delta-sigma modulator 300*b*, a phase shifter 400*b*, a quantization noise canceller 500*b*, a digital-to-time converter 600*b*, a first adder 250*b* and a second adder 350*b*.

The fractional divider 100*b* may be substantially the same as the fractional divider 100*a* of FIG. 3, except that configurations of the delta-sigma modulator 300*b* and the phase shifter 400*b* are changed.

The delta-sigma modulator 300*b* may generate a delta-sigma modulation signal DSM_OUT2 based on the first division clock signal CK_DIV and the fractional part FCW_FR of the frequency control word FCW In some example embodiments, the delta-sigma modulator 300*b* may have a MASH structure. For example, the delta-sigma modulator 300*b* may be a MASH 1-1-1 type delta-sigma modulator, and the delta-sigma modulation signal DSM_OUT2 may be a 3-bit digital signal Since the MASH 1-1-1 type delta-sigma modulator is also well known to those skilled in the art, a detailed description thereof will be omitted.

The first adder 250*b* may generate a first control signal CON12 by adding the integer part FCW_INT of the frequency control word FCW and the delta-sigma modulation signal DSM_OUT2. The integer divider 200*b* may generate the first division clock signal CK_DIV based on the first clock signal CK_VCO<0> and the first control signal CON12. The second adder 350*b* may generate a difference signal DIF2 by subtracting the delta-sigma modulation signal DSM_OUT2 from the fractional part FCW_FR of the frequency control word FCW.

The quantization noise canceller 500*b* may generate the quantization error signal QE<N−1:0> based on the difference signal DIF2, may generate a second control signal CON22, a third control signal CON32 and a fourth control signal that correspond to the quantization error signal QE<N−1:0>, and may generate the digital control word DCW based on the third control signal CON32. The quantization noise canceller 500*b* may include an accumulator 510*b* and a gain controller 520*b*.

The accumulator 510*b* may generate the quantization error signal QE<N−1:0> based on the difference signal DIF2. For example, the quantization error signal QE<N−1: 0> that represents or corresponds to a quantization noise of the delta-sigma modulator 300b may be generated by integrating or accumulating the difference signal DIF2 that represents or corresponds to a difference between the fractional part FCW_FR of the frequency control word FCW and the delta-sigma modulated signal DSM_OUT2.

In some example embodiments, each of the second control signal CON22, the third control signal CON32 and the fourth control signal may correspond to a portion of the quantization error signal QE<N−1:0>. For example, the fourth control signal may correspond to a first portion QE<N−1:N−2> of the quantization error signal QE<N−1:0>, the second control signal CON22 may correspond to a second portion QE<N−3:N−M−3> of the quantization error signal QE<N−1:0> that is different from the first portion QE<N−1:N−2>, and the third control signal CON32 may correspond to a third portion QE<N−M−4:N−M−K−4> that is different from the first portion QE<N−1:N−2> and the second portion QE<N−3:N−M−3>.

Figure 8:
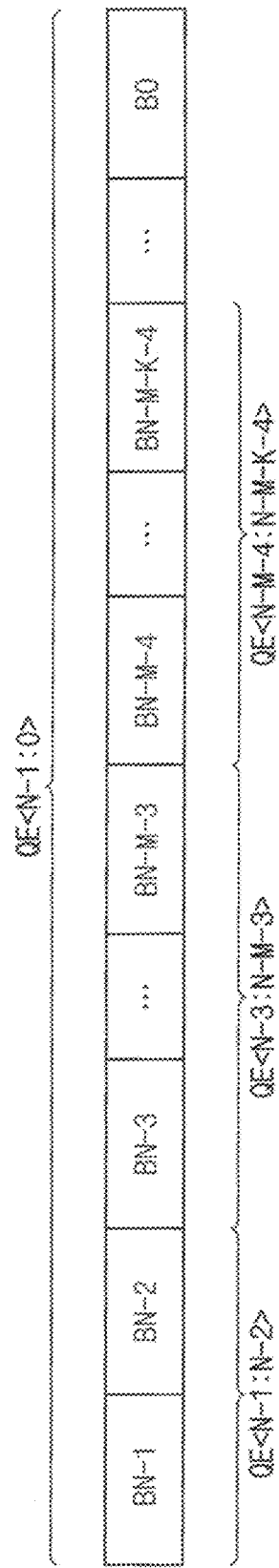
FIG. 8 is a diagram for describing a quantization error signal that is generated by an accumulator included in a fractional divider of FIG. 7.

FIG. 8 is a diagram for describing a quantization error signal that is generated by an accumulator included in a fractional divider of FIG. 7. The descriptions repeated with FIG. 4 will be omitted.

Referring to FIG. 8, the quantization error signal QE<N−1:0> may be expressed as a digital value including N bits BN−1, BN−2, BN−3, . . . , BN−M−3, BN−M−4, . . . , BN−M−K−4, . . . , B0.

The fourth control signal in FIG. 7, e.g., the first portion QE<N−1:N−2> of the quantization error signal QE<N−1:0>, may include the upper two bits BN−1 and BN−2 including an MSB (e.g., BN−1) among the N bits BN−1 to B0.

The second control signal CON22 in FIG. 7, e.g., the second portion QE<N−3:N−M−3> of the quantization error signal QE<N−1:0>, may include (M+1) bits BN−3 to BN−M−3 among the N bits BN−1 to B0. The (M+1) bits BN−3 to BN−M−3 may be different from the two bits BN−1 and BN−2.

The third control signal CON32 in FIG. 7, e.g., the third portion QE<N−M−4:N−M−K−4> of the quantization error signal QE<N−1:0>, may include (K−1) bits BN−M−4 to BN−M−K−4 among the N bits BN−1 to B0. The (K−1) bits BN−M−4 to BN−M−K−4 may be different from the two bits BN−1 and BN−2 and the (M+1) bits BN−3 to BN−M−3.

Referring again to FIG. 7, the gain controller 520b may generate the digital control word DCW based on the third control signal CON32 and the phase detection signal ES. For example, as described above, the third control signal CON32 may correspond to the third portion QE<N−M−4:N−M−K−4> of the quantization error signal QE<N−1:0> and may include the (K+1) bits (e.g., the bits BN−M−4 to BN−M−K−4 in FIG. 8). The gain controller 520b may perform the K-bit gain correction.

The phase shifter 400b may generate the second division clock signal CK_DTC_C based on the plurality of clock signals CK_VCO<0> to CK_VCO<$2^M$−1>, the first division clock signal CK_DIV and the second control signal CON22. The phase shifter 400b may include a multiplexer 410b a masking circuit 420b, a delay circuit 430b, a counter 450b, a comparator 460b and a pulse generator 440b.

The multiplexer 410b may select one of the plurality of clock signals CK_VCO<0> to CK_VCO<$2^M$−1> based on the second control signal CON22. For example, as described above, the second control signal CON22 may correspond to the second portion QE<N−3:N−M−3> of the quantization error signal QE<N−1:0> and may include the (M+1) bits (e.g., the bits BN−3 to BN−M−3 in FIG. 8). A signal selected by the multiplexer 410b may be output as the first selection clock signal CK_MUX.

The masking circuit 420b may mask the first selection clock signal CK_MUX based on the first division clock signal CK_DIV. The delay circuit 430b may generate the second selection clock signal CK_MUX_M by delaying an output of the masking circuit 420b.

The counter 450b may generate a count signal CNT_MUX based on the second selection clock signal CK_MUX_M. For example, the count signal CNT_MUX may be generated by counting pulses included in the second selection clock signal CK_MUX_M. For example, the counter 450b may be a digital counter. For example, when the fourth control signal input to the comparator 460b includes two bits, the counter 450b may be implemented as a 2-bit digital counter. However, example embodiments are not limited thereto.

The comparator 460b may generate a comparison signal COMP based on the count signal CNT_MUX, the fourth control signal that corresponds to the quantization noise of the delta-sigma modulator 300b, and an offset signal OFS. For example, the comparison signal COMP may be generated by comparing the count signal CNT_MUX with the sum of the fourth control signal and the offset signal OFS. For example, the comparator 460b may be a digital comparator For example, as described above, the fourth control signal may correspond to the first portion QE<N−1:N−2> of the quantization error signal QE<N−1:0> and may include the two bits (e.g., the bits BN−1 and BN−2 in FIG. 8). For example, when the fourth control signal includes 2 bits and the counter 450b is a 2-bit digital counter, a value of the offset signal OFS may be set to two.

The pulse generator 440b may generate the second division clock signal CK_DTC_C based on the first division clock signal CK_DIV and the comparison signal COMP. The comparison signal COMP may be served or used as a driving clock of the pulse generator 440b.

The digital-to-time converter 600b may generate the final division clock signal CK_F based on the second division clock signal CK_DTC_C and the digital control word DCW.

Figure 9A:
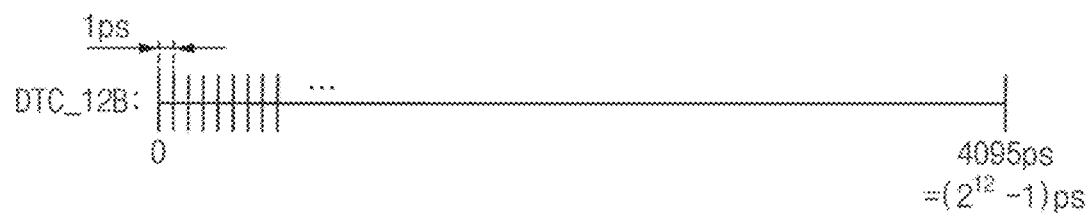
FIGS. 9A, 9B and 10 are diagrams for describing an operation of a fractional divider of FIG. 7.
Figure 9B:
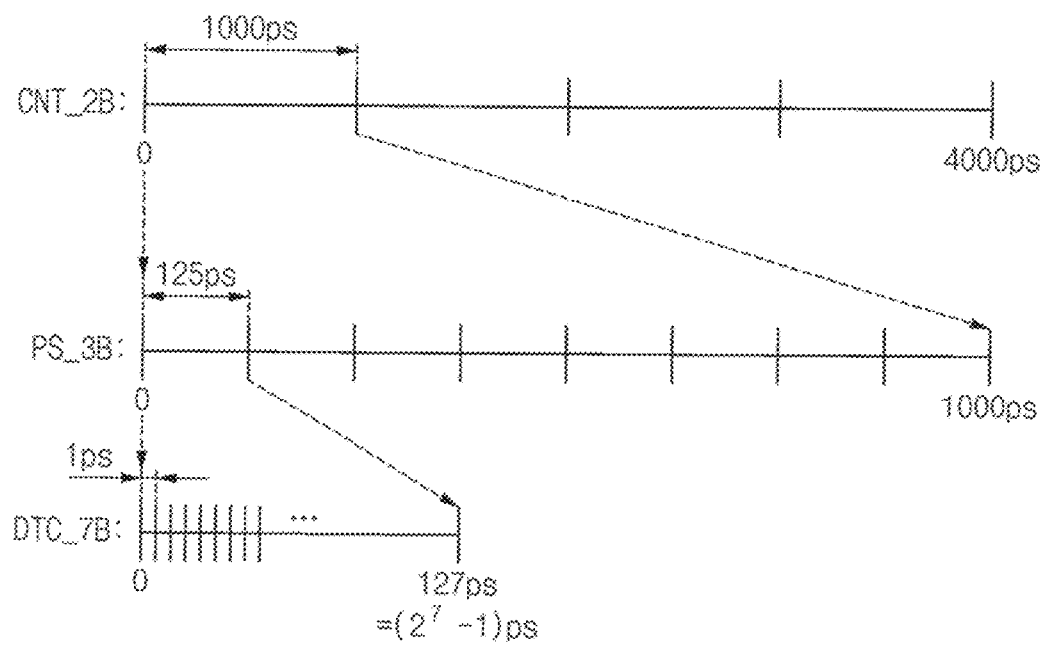
Figure 10:
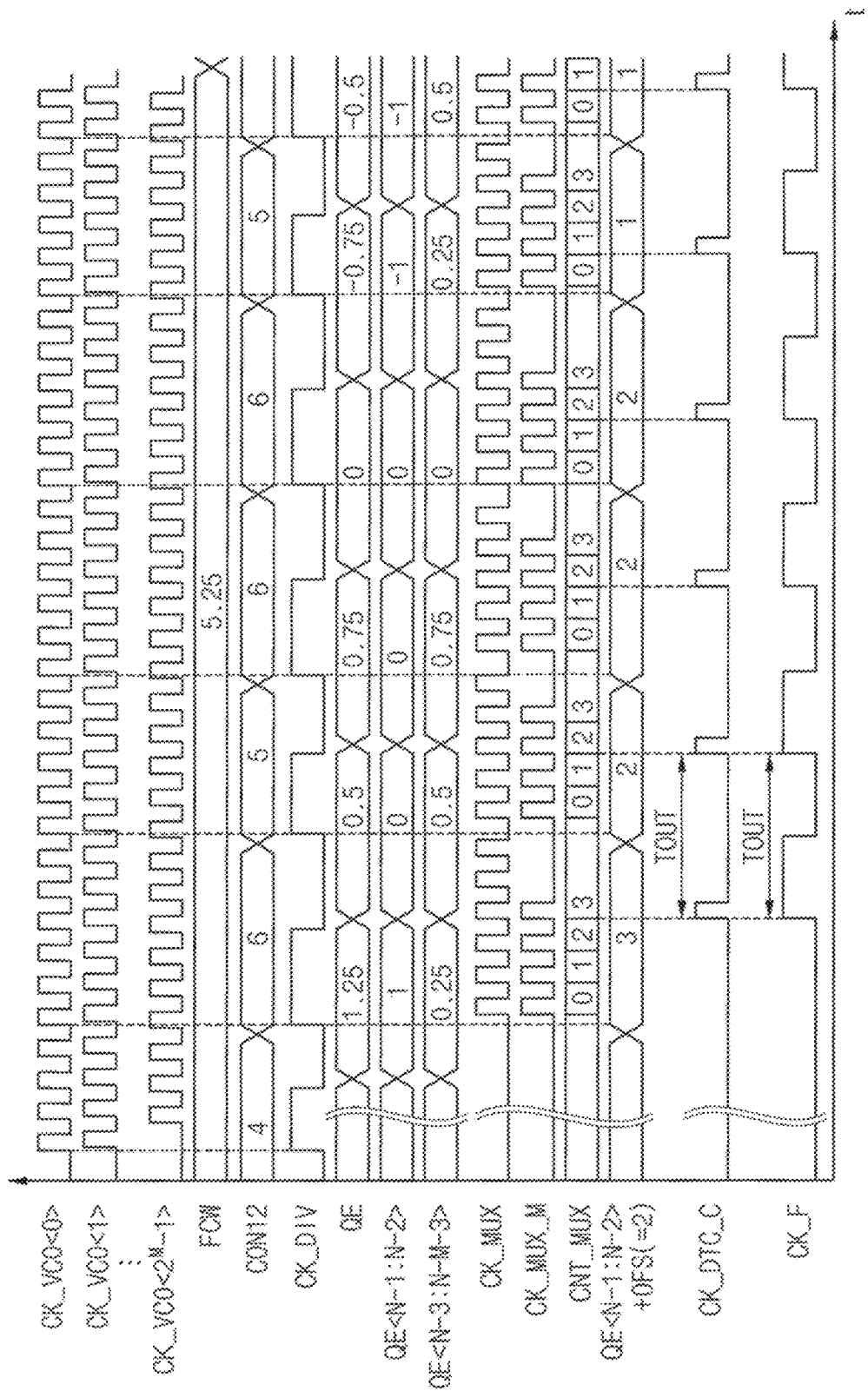

FIGS. 9A, 9B and 10 are diagrams for describing an operation of a fractional divider of FIG. 7. The descriptions repeated with FIGS. 5A, 5B, 5C and 6 will be omitted.

FIG. 9A illustrates a conventional operation in which a conventional fractional divider using only a digital-to-time converter generates a time delay corresponding to a quantization noise of a delta-sigma modulator. FIG. 9B illustrates an operation according to some example embodiments in which the fractional divider 100b using both the phase shifter 400b and the digital-to-time converter 600b together generates the time delay corresponding to the quantization noise of the delta-sigma modulator 300b.

In a case of the MASH 1-1-1 type delta-sigma modulator described with reference to FIG. 7, the range of the quantization noise may be four periods (e.g., 4*TVCO) of the input clock signal of the fractional divider. In addition, as described with reference to FIG. 5A, the period TVCO of the input clock signal of the fractional divider may be about 1 ns (=about 1000 ps). When the delta-sigma modulator is the MASH 1-1-1 type delta-sigma modulator, the range of the time delay generated based on the quantization noise of the MASH 1-1-1 type delta-sigma modulator (e.g., based on QE<N−1:0> in FIG. 7) may be −2*TVCO≤t(QE)≤2*TVCO, and thus the dynamic range of the digital-to-time converter should be at least 4*TVCO.

Referring to FIG. 9A, for convenience of explanation, it is illustrated that the resolution of the digital-to-time converter is about 1 ps in the conventional fractional divider using only the digital-to-time converter. In this case, to design the dynamic range of the digital-to-time converter to be greater than 4*TVCO (e.g. greater than about 4000 ps), a 12-bit digital-to-time converter DTC_12B (e.g., the digital-to-time converter with the bit-width of twelve) should be used. For example, the dynamic range of the 12-bit digital-to-time converter DTC_12B may be about 4095 ps (=about ($2^{12}$–1) ps).

Referring to FIG. 9B, for convenience of explanation, it is illustrated that M=3 in the fractional divider 100b according to some example embodiments using both the phase shifter 400b and the digital-to-time converter 600b together. In addition, as with the example of FIG. 9A, it is illustrated that the resolution of the digital-to-time converter 600b is about 1 ps in the fractional divider 100b according to some example embodiments using both the phase shifter 400b and the digital-to-time converter 600b together.

First, the counter 450b may be implemented as a 2-bit digital counter CNT_2B, and may operate as a 2-bit digital-to-time converter with a resolution of about 1000 ps, which is TVCO. For example, a time delay equivalent to TVCO may be generated by counting the second selection clock signal CK_MUX_M using the counter 450b to generate the count signal CNT_MUX. For example, the count signal CNT_MUX may have a time delay corresponding to $n*TVCO+m*TVCO/2^M$, where each of n and m is zero or a natural number. The time delay corresponding to n*TVCO may be obtained by comparing the count signal CNT_MUX with the sum of the fourth control signal (e.g., QE<N–1:N–2>) and the offset signal OFS using a comparator 460b, and may be determined as a multiple of TVCO depending on a change in the value of QE<N–1:N–2>. The time delay corresponding to $m*TVCO/2^M$ may be determined based on QE<N–3:N–M–3> rather than the two bits including the MSB (e.g., QE<N–1:N–2>).

Thereafter, as with that described with reference to FIG. 5C, the phase shifter 400a may be implemented as a 3-bit phase shifter PS_3B, and may operate as a 3-bit digital-to-time converter with a resolution of about 125 ps, which is $TVCO/2^3$. Therefore, the dynamic range of the digital-to-time converter 600b may be designed to be greater than about 125 ps, which is $TVCO/2^3$, and a 7-bit digital-to-time converter DTC_7B (e.g., the digital-to-time converter with the bit-width of seven) may be used.

As described with reference to FIG. 1, the final division clock signal CK_F may be generated by adding the time delay corresponding to the quantization noise of the delta-sigma modulator 300b to the first division clock signal CK_DIV. In addition, the phase shifter 400b may generate the course time delay included the time delay, and the digital-to-time converter 600b may generate the fine time delay included the time delay. For example, when the time delay is represented or expressed as a digital value including (X+M+K) bits, where each of X, M and K is a natural number, the course time delay may correspond to upper (X+M) bits among the (X+M+K) bits, and the fine time delay may correspond to lower K bits among the (X+M+K) bits. Further, the upper X bits among the (X+M) bits may be determined by the counter 450b. When the digital-to-time converter having the same resolution is used in the examples of FIGS. 9A and 9B, the bit-width of the digital-to-time converter included in the conventional fractional divider based on the example of FIG. 9A may be the (X+M+K) bits, and the bit-width of the digital-to-time converter 600b included in the fractional divider 100b based on the example of FIG. 9B may be the K bits, which is reduced by (X+M) bits as compared with the example of FIG. 9A. For example, FIG. 9B illustrates the example where X=2, M=3 and K=7, and the bit-width of the digital-to-time converter may be reduced from twelve bits to seven bits by using the 2-bit digital counter CNT_2B and the 3-bit phase shifter PS_3B.

As described above, when the time delay greater than TWO is required, the time delay having the resolution of TVCO may be generated using the counter. As compared with the example of FIG. 3, the fractional divider 100b may further include the counter 450b and the comparator 460b, and thus may be simply implemented to cover the time delay of TVCO or greater.

Referring to FIG. 10, a detailed operation timing of the fractional divider 100b is illustrated. In an example of FIG. 10, a value of the frequency control word FCW may be 5.25.

For example, the first control signal CON2 that is input to the integer divider 200b may have a value that is obtained by adding five, which is the integer part FCW_INT of the frequency control word FCW, to the delta-sigma modulation signal DSM_OUT2, which is dithered by the delta-sigma modulator 300b. The first division clock signal CK_DIV may be output in synchronization with the rising edge of the first clock signal CK_VCO<0>. A value of the quantization error signal QE may be calculated in synchronization with the falling edge of the first division clock signal CK_DIV. An initial value of the quantization error signal QE may be zero.

First, when the first control signal CON12 is 4, the value of the quantization error signal QE may be 0+(5.25–4)=1.25, QE<N–1:N–2> representing the integer part of the quantization error signal QE may be one, and QE<N–3:N–M–3> representing the fractional part of the quantization error signal QE may be 0.25. Before the subsequent rising edge of the first division clock signal CK_DIV, the phase shifter 400b may generate the time delay based on the value of the quantization error signal QE. For example, when QE<N–3:N–M–3>=0.25, a clock signal closest to a signal shifted in phase by 0.25*TVCO from the first clock signal CK_VCO<0> may be selected as the first selection clock signal CK_MUX. And then, the second selection clock signal CK_MUX_M may be generated by masking the first selection clock signal CK_MUX for a predetermined time interval. The first selection clock signal CK_MUX may be a signal having a relatively high frequency and thus large power consumption, and thus the first selection clock signal CK_MUX may be masked so as not to be toggled any more after the predetermined time interval required to generate the time delay. The second selection clock signal CK_MUX_M may have time delay information that corresponds to 0.25*TVCO and is represented by QE<N–3:N–M–3>. Further, to generate the time delay that corresponds to 1*TVCO and is represented by QE<N–1:N–2>, the count signal CNT_MUX may be generated by counting the second selection clock signal CK_MUX_M. For example, when the counter 450b is implemented as the 2-bit digital counter CNT_2B, the count signal CNT_MUX may have a value from zero to three by the toggle of the second selection clock signal CK_MUX_M. A reference value of the comparator 460b may be generated by adding two, which is the value of the offset signal OFS, to QE<N–1:N–2>. For example, when QE<N–1:N–2>=1, the reference value may become three. When the count signal CNT_MUX reaches three, the pulse generator 440b may operate to generate the second division clock signal CK_DTC_C. and the final division clock signal CK_F may be generated based on the second division clock signal CK_DTC_C.

Next, when the first control signal CON12 is 6, the value of the quantization error signal QE may be 0.5 that is obtained by subtracting 0.75 from the previously obtained value 1.25 (e.g., QE=1.25+(5.25−6)=0.5). In this case, QE<N−1:N−2>=0, QE<N−3:N−M−3>=0.5, and a clock signal closest to a signal shifted in phase by 0.5*TVCO from the first clock signal CK_VCO<0> may be selected as the first selection clock signal CK_MUX. As with that described above, the second selection clock signal CK_MX_M, the count signal CNT_MUX, the second division clock signal CK_DTC_C and the final division clock signal CK_F may be generated. The reference value of the comparator 460b may become 0+2=2, and when the count signal CNT_MUX reaches two, the second division clock signal CK_DTC_C may be toggled.

Thereafter, when the first control signal CON12 is 5, QE=0.5+(5.25−5)=0.75, QE<N−1:N−2>=0, QE<N−3:N−M−3>=0.75, and the reference value of the comparator 460b nay become 0+2=2. Thereafter, when the first control signal CON12 is 6, QE=0.75+(5.25−6)=0, QE<N−1:N−2>=0, QE<N−3:N−M−3>=0, and the reference value of the comparator 460b may become 0−1−2=2. Thereafter, when the first control signal CON12 is 6, QE=0+(5.25−6)=−0.75, QE<N−1:N−2>=−1, QE<N−3:N−M−3>=0.25, and the reference value of the comparator 460b may become −1+2=1. Thereafter, when the first control signal CON12 is 5, QE=−0.75+(5.25−5)=−0.5, QE<N−1:N−2>=−1, QE<N−3:N−M−3>=0.5, and the reference value of the comparator 460b may become −1+2=1. As with that described above, the first selection clock signal CK_MUX may be selected in every cycle, and the second selection clock signal CK_MUX_M, the count signal CNT_MUX, the second division clock signal CK_DTC_C and the final division clock signal CK_F may be generated in every cycle. In addition, the value of the quantization error signal QE may vary or may be changed every cycle, and the time delay added to the first division clock signal CK_DIV may be changed depending on the quantization error signal QE.

In the example of FIG. 10 where FCW=5.25, the fractional part FCW_FR of the frequency control word FCW may be relatively simply expressed as 0.25, so that the fine digital-to-time conversion by the digital-to-time converter 600a may not be performed and may be omitted. However, example embodiments are not limited thereto, and when the fractional part FCW_FR of the frequency control word FCW is relatively complicatedly expressed, the time delay may be represented or expressed in more detail by using the digital-to-time converter 600b.

Figure 11:
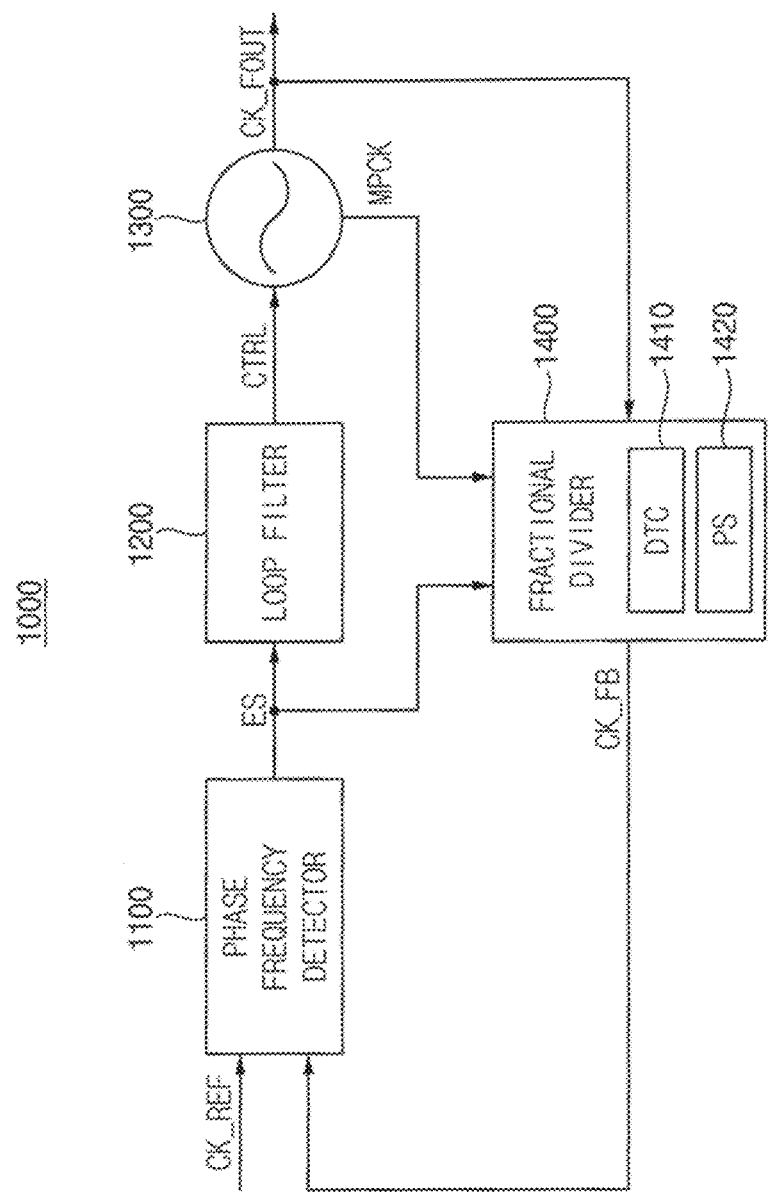
FIGS. 11, 12 and 13 are block diagrams illustrating a fractional phase locked loop according to some example embodiments.
Figure 12:
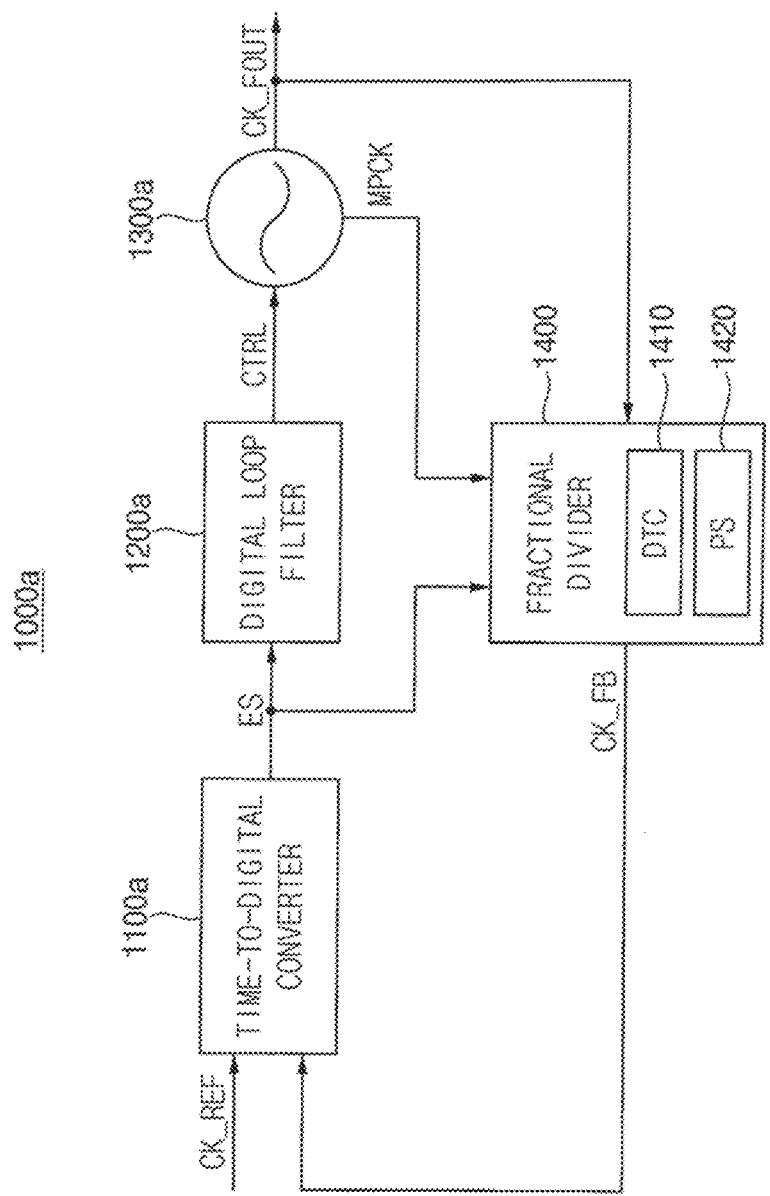
Figure 13:
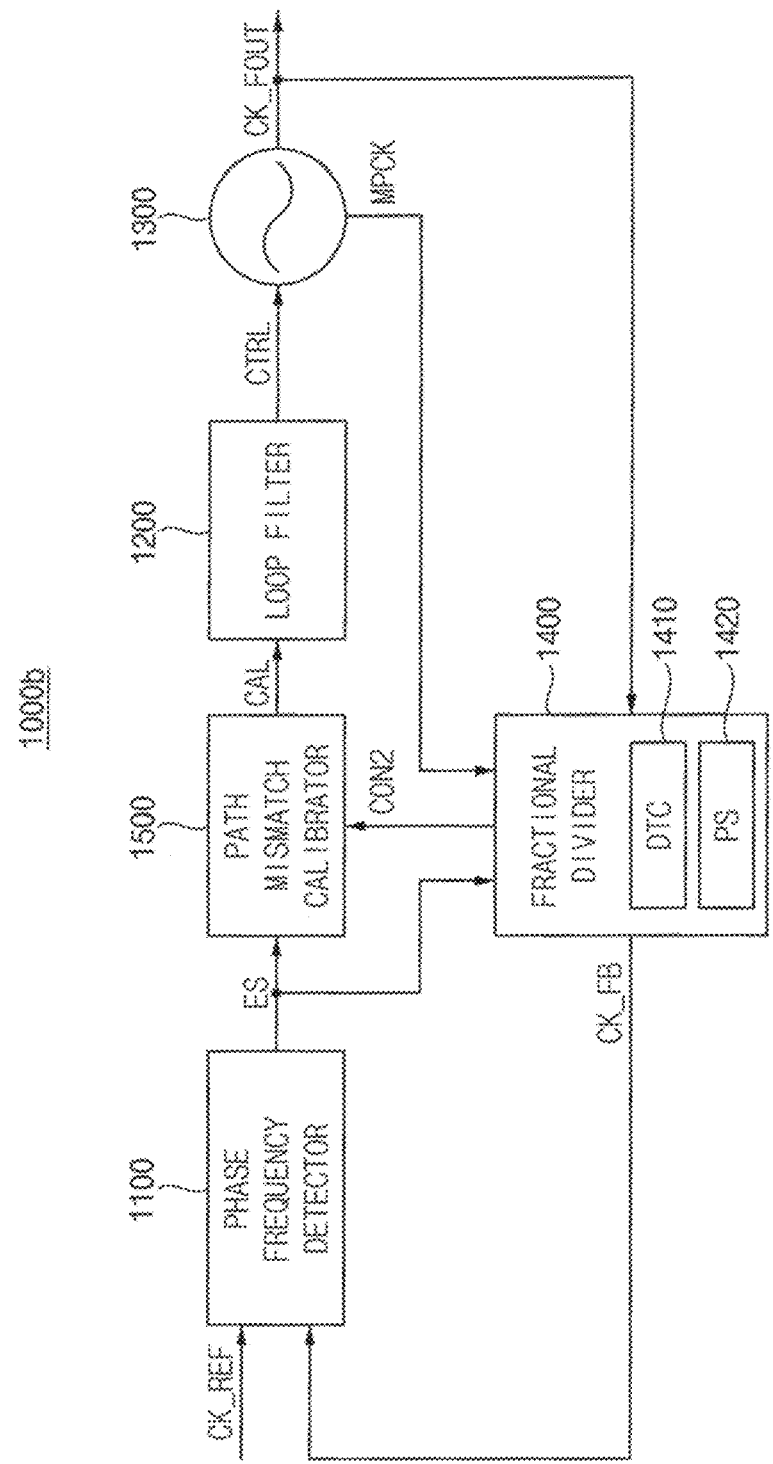

FIGS. 11, 12 and 13 are block diagrams illustrating a fractional phase locked loop according to some example embodiments.

Referring to FIG. 11, a fractional phase locked loop 1000 includes a phase frequency detector 1100, a loop filter 1200, a multi-phase voltage controlled oscillator 1300 and a fractional divider 1400.

The phase frequency detector 1100 generates a phase detection signal ES based on a reference clock signal CK_REF and a feedback clock signal CK_FB. For example, the reference clock signal CK_REF may be an input clock signal of the fractional phase locked loop 1000.

In some example embodiments, the phase detection signal ES may include a first phase detection signal (e.g., an up signal) and a second phase detection signal (e.g., a down signal). For example, when a phase of the feedback clock signal CK_FB lags behind a phase of the reference clock signal CK_REF, the phase frequency detector 1100 may generate the first phase detection signal for adjusting a phase of an output clock signal CK_FOUT toward a first direction. For example, when the phase of the feedback clock signal CK_FB leads the phase of the reference clock signal CK_REF, the phase frequency detector 1100 may generate the second phase detection signal for adjusting the phase of the output clock signal CK_FOUT toward a second direction opposite to the first direction. In some example embodiments, the phase frequency detector 1100 may be implemented as a bang-bang phase frequency detector, but example embodiments are not limited thereto.

The loop filter 1200 generates an output control signal CTRL based on the phase detection signal ES. For example, the loop filter 1200 may increase or decrease a voltage level of an output voltage (e.g., the output control signal CTRL) based on the phase detection signal ES.

In some example embodiments, the fractional phase locked loop 1000 may further include a charge pump (not illustrated) connected to the loop filter 1200. For example, the charge pump may source a current (e.g. a control current) output from a power supply to an output terminal, or may sink a current from the output terminal to a ground, based on the phase detection signal ES. For example, the charge pump 1220 may source the current output from the power supply based on the first phase detection signal, and may sink a current to the ground based on the second phase detection signal. For example, the loop filter 1200 may increase the output voltage based on a sourced current, or may decrease the output voltage based on a sunk current. For example, the loop filter 1200 may generate a voltage varying based on the sourced or sunk current.

The multi-phase voltage controlled oscillator 1300 generates a multi-phase clock signal MPCK based on the output control signal CTRL and generates the output clock signal CK_FOUT based on the multi-phase clock signal MPCK. For example, as described with reference to FIG. 1, the multi-phase clock signal MPCK may include a plurality of clock signals CK_VCO<0> to CK_VCO<$2^M$−1> of which phases partially overlap each other. The multi-phase voltage controlled oscillator 1300 generates the plurality of clock signals CK_VCO<0> to CK_VCO<$2^M$−1>, and to output one of the plurality of clock signals CK_VCO<0> to CK_VCO<$2^M$−1> as the output clock signal CK_FOUT. For example, an output frequency of the output clock signal CK_FOUT may be a real number multiple of an input frequency of the reference clock signal CK_REF.

The fractional divider 1400 generates the feedback clock signal CK_FB by dividing the output clock signal CK_FOUT. For example, the fractional divider 1400 may perform a fractional division operation based on the phase detection signal ES and the multi-phase clock signal MPCK (e.g., the plurality of clock signals CK_VCO<0> to CK_VCO<$2^M$−1>).

The fractional divider 1400 may be the fractional divider according to some example embodiments. For example, the fractional divider 1400 may include a digital-to-time converter 1410 and a phase shifter 1420, and may further include an integer divider, a delta-sigma modulator, a quantization noise canceller, a first adder and a second adder, as described with reference to FIG. 1. The digital-to-time converter 1410 may correspond to the digital-to-time converter 600 in FIG. 1, and the phase shifter 1420 may correspond to the phase shifter 400 in FIG. 1 and may operate based on the multi-phase clock signal MPCK. The output clock signal CK_FOUT may correspond to the input clock signal CK_VCO in FIG. 1, and the feedback clock signal CK_FB may correspond to the final division clock signal CK_F in FIG. 1.

The fractional divider 1400 may perform the quantization noise cancellation based on the digital-to-time converter. For example, the fractional divider 1400 may generate the feedback clock signal CK_FB by which the output clock signal CK_FOUT is fractionally divided using the integer divider and the delta-sigma modulator, and may generate the time delay for canceling or removing the quantization noise of the delta-sigma modulator using the phase shifter 1420 and the digital-to-time converter 1410. In addition, the phase shifter 1420 may generate the coarse time delay by performing the coarse digital-to-time conversion and the digital-to-time converter 1410 may generate the fine time delay by performing the fine digital-to-time conversion.

The fractional phase locked loop 1000 according to some example embodiments may include the multi-phase voltage controlled oscillator 1300 that generates the multi-phase clock signal MPCK, and may include the fractional divider 1400 including the phase shifter 1420 that operates based on the multi-phase clock signal MPCK. The course digital-to-time conversion may be performed using the multi-phase clock signal MPCK from the multi-phase voltage controlled oscillator 1300 that is a component of the fractional phase locked loop 1000, and using the phase shifter 1420 that is smaller in size and has less power consumption than the digital-to-time converter 1410. Accordingly, the dynamic range of the digital-to-time converter 1410 may be reduced. Further, the phase shifter 1420 may be implemented as a fully digital circuit and implemented in a manner that reuses the multi-phase clock signal MPCK, which is the output of the multi-phase voltage controlled oscillator 1300, and thus the fractional phase locked loop 1000 may have reduced power consumption and size.

Referring to FIG. 12, a fractional phase locked loop 1000*a* may include a time-to-digital converter 1100*a*, a digital loop filter 1200*a*, a multi-phase digitally controlled oscillator 1300*a* and a fractional divider 1400. The descriptions repeated with FIG. 11 will be omitted.

The fractional phase locked loop 1000*a* may be substantially the same as the fractional phase locked loop 1000 of FIG. 11, except that the phase frequency detector 1100, the loop filter 1200 and the multi-phase voltage controlled oscillator 1300 in FIG. 11 are implemented as the time-to-digital converter 1100*a*, the digital loop filter 1200*a* and the multi-phase digitally controlled oscillator 1300*a*, respectively.

The time-to-digital converter 1100*a* may generate the phase detection signal ES based on the reference clock signal CK_REF and the feedback clock signal CK_FB. The digital loop filter 1200*a* may generate the output control signal CTRL based on the phase detection signal ES. For example, the phase detection signal ES and the output control signal CTRL may be a k-bit digital signal, where k is a natural number, and may be represented as e[k] and CTRL[k], respectively.

The multi-phase digitally controlled oscillator 1300*a* may generate the plurality of clock signals CK_VCO<0> to CK_VCO<$2^M$−1>, which are the multi-phase clock signal MPCK, based on the output control signal CTRL, and may output one of the plurality of clock signals CK_VCO<0> to CK_VCO<$2^M$−1> as the output clock signal CK_FOUT. For example, the multi-phase digitally controlled oscillator 1300*a* may include an M-bit multi-phase ring oscillator.

Referring to FIG. 13, a fractional phase locked loop 1000*b* may include a phase frequency detector 1100, a loop filter 1200, a multi-phase voltage controlled oscillator 1300, a fractional divider 1400 and a path mismatch calibrator 1500. The descriptions repeated with FIG. 11 will be omitted for brevity.

The fractional phase locked loop 1000*b* may be substantially the same as the fractional phase locked loop 1000 of FIG. 11, except that the fractional phase locked loop 1000*b* further includes the path mismatch calibrator 1500.

The path mismatch calibrator 1500 may compensate delay errors of the plurality of clock signals CK_VCO<0> to CK_VCO<$2^M$−1>, which are the multi-phase clock signal MPCK, based on the phase detection signal ES and a second control signal CON2, and may generate a calibration signal CAL. The delay errors may occur due to path mismatch of the plurality of clock signals CK_VCO<0> to CK_VCO<$2^M$−1>. For example, the second control signal CON2 may be the second control signal CON2 in FIG. 1 that is generated by the quantization noise canceller 500 in FIG. 1. The loop filter 1200 may generate the output control signal CTRL based on the calibration signal CAL that is an output of the path mismatch calibrator 1500.

When there is the path mismatch from the output of the multi-phase voltage controlled oscillator 1300 to the phase shifter 1420 included in the fractional divider 1400, the path mismatch calibrator 1500 may be implemented to reduce, cancel, or remove the delay errors occurring due to the path mismatch. For example, the path mismatch calibrator 1500 may include a least mean square (LMS) loop that reduces the delay errors to almost zero by adding or subtracting an offset, which corresponds to the delay errors occurring due to the path mismatch, to or from the phase detection signal ES, and the least mean square loop may operate based on a correlation between the second control signal CON2 (e.g., the quantization error signal QE<N−1:0> or a portion thereof) that is an input of the phase shifter 1420 and the phase detection signal ES that is an output of the phase frequency detector 1100. For example, the delay errors occurring due to the path mismatch may be calibrated in background operation. As a result, in the correction signal CAL that is the output of the path mismatch calibrator 1500, the delay errors occurring due to the deterministic path mismatch may be reduced, canceled, or removed and only the phase error may remain, and thus the spur of the output clock signal CK_FOUT that is the output of the fractional phase locked loop 1000*b* may be reduced.

In some example embodiments, the path mismatch corrector 1500 in FIG. 13 may also be included in the fractional phase locked loop 1000*a* of FIG. 12. For example, the calibration signal CAL may be represented as c[k].

Figure 14:
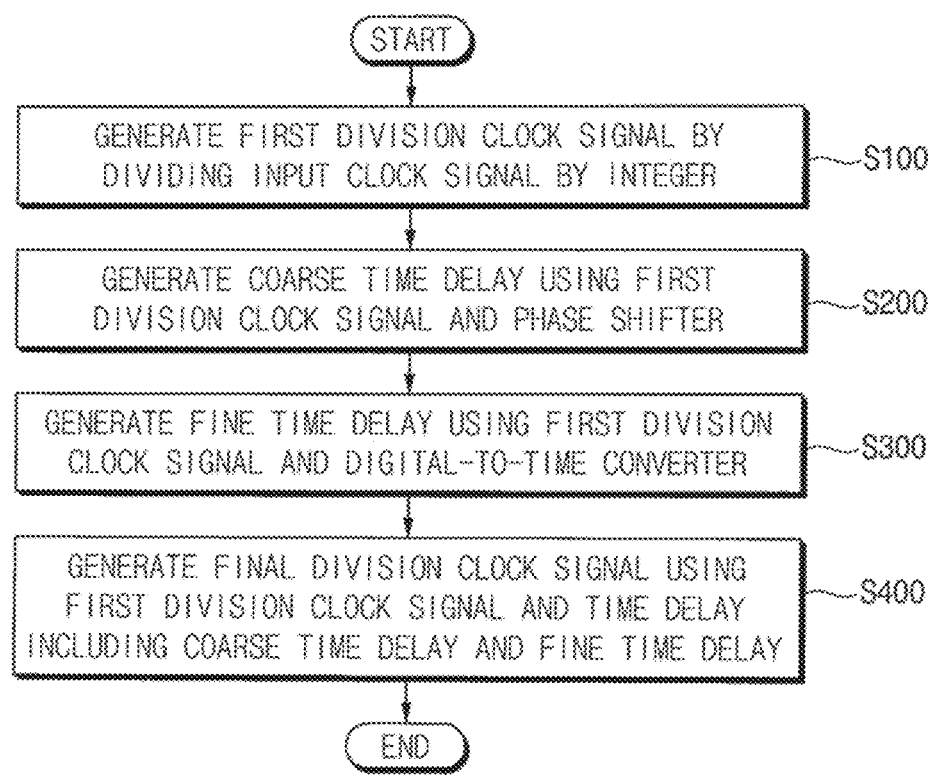
FIG. 14 is a flowchart illustrating a method of performing a fraction-division on a clock signal according to some example embodiments.

FIG. 14 is a flowchart illustrating a method of performing a fraction-division on a clock signal according to some example embodiments.

Referring to FIGS. 1 and 14, in a method of performing a fraction-division on a clock signal according to some example embodiments, the first division clock signal CK_DIV is generated by dividing the input clock signal CK_VCO by an integer (step S100). For example, step S100 may be performed by the integer divider 200, the delta-sigma modulator 300, and the first adder 250.

The coarse time delay is generated using the first division clock signal CK_DIV and the phase shifter 400 (step S200), and the fine time delay is generated using the first division clock signal CK_DIV and the digital-to-time converter 600 (step S300). For example, step S200 is performed by the second adder 350, the quantization noise canceller 500 and the phase shifter 400, and step S300 may be performed by the second adder 350, the quantization noise canceller 500 and the digital-to-time converter 600. For example, steps S200 and S300 may be substantially at least partially or wholly simultaneously and/or concurrently performed.

The final division clock signal CK_F is generated using the first division clock signal CK_DIV and the time delay including the coarse time delay and the fine time delay (step S400). For example, the time delay may be added to the first division clock signal CK_DIV, which is a signal obtained by the integer-division of the input clock signal CK_VCO, and thus the final division clock signal CK_F, which is a signal obtained by the fractional-division of the input clock signal CK_VCO, may be generated. For example, step S400 may be performed by the phase shifter 400 and the digital-to-time converter 600.

Figure 15:
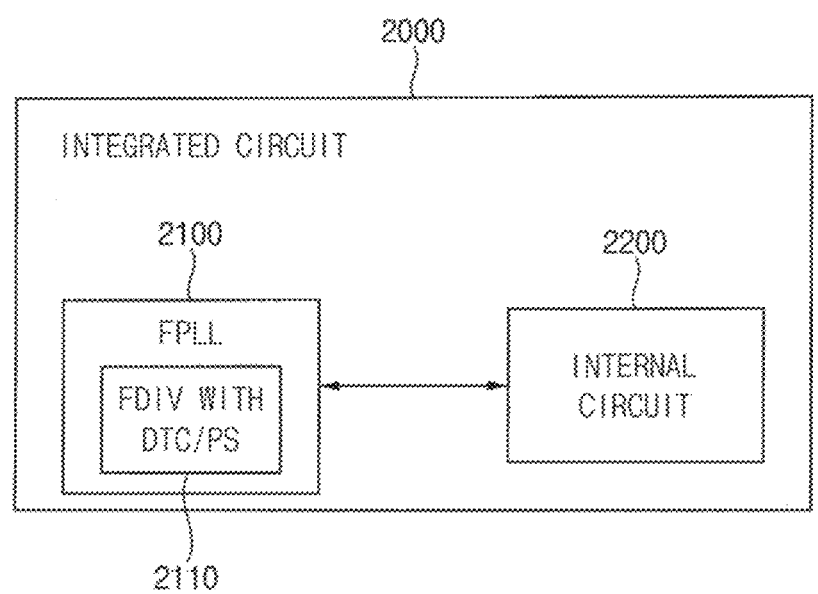
FIG. 15 is a block diagram illustrating an integrated circuit including a fractional phase locked loop according to some example embodiments.

FIG. 15 is a block diagram illustrating an integrated circuit including a fractional phase locked loop according to some example embodiments.

Referring to FIG. 15, an integrated circuit 2000 includes a fractional phase locked loop (FPLL) 2100 and an internal circuit 2200.

The fractional phase locked loop 2100 may be or may include the fractional phase locked loop according to some example embodiments. For example, the fractional phase locked loop 2100 may include a fractional divider (FDIV) 2110 that includes a digital-to-time converter (DTC) and a phase shifter (PS), and the phase shifter may perform the course digital-to-time conversion based on the multi-phase clock signal MPCK. Accordingly, the dynamic range of the digital-to-time converter may be reduced, and the fractional divider 2110 and the fractional phase locked loop 2100 may have reduced power consumption and size.

The internal circuit 2200 may be driven or perform a specific operation based on an output clock signal from the fractional phase locked loop 2100.

FIG. 16 is a block diagram illustrating a digital processing system including a fractional phase locked loop according to some example embodiments.

Referring to FIG. 16, a digital processing system 3000 includes a master device 3100 and a plurality of slave devices 3200, 3300, 3400, 3500, 3600, 3700, 3800 and 3900.

In some example embodiments, the digital processing system 3000 may be or may include or be included in any electronic system, such as one or more of a personal computer (PC), a mobile phone, a smart phone, a tablet computer, a laptop computer, a personal digital assistant (PDA), an enterprise digital assistant (EDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The master device 3100 may be or may include a controller circuit and/or a processor which can actively control the plurality of slave devices 3200, 3300, 3400, 3500, 3600, 3700, 3800 and 3900. For example, the master device 3100 may be implemented as one or more of a baseband modem processor chip, a chip which can function as both a modem and an application processor (AP), an AP, or a mobile AP, but example embodiments are not limited thereto.

Each of the slave devices 3200, 3300, 3400, 3500, 3600, 3700, 3800 and 3900 may be one of various circuits and/or devices which can passively operate based on a control of the master device 3100. For example, the slave devices 3200, 3300, 3400, 3500, 3600, 3700, 3800 and 3900 may include one or more of a radio frequency integrated circuit (RFIC) 3200, a power management integrated circuit (PMIC) 3300, a power supply module 3400, a secondary RFIC 3500, a sensor 3600, a fingerprint recognition chip 3700, a touch screen controller 1800, and a display driver integrated circuit or digital display interface (DDI) 3900.

The RFIC 3200 may include at least one connectivity chip. For example, the connectivity chip may include one or more of a chip 3210 for mobile communication, a chip 3220 for wireless local area network (WLAN) (e.g., WiFi), a chip 3230 for Bluetooth communication, a chip 3240 for global navigation satellite system (GNSS) communication, a chip 3250 for processing frequency modulation (FM) audio/video, and a chip 3260 for near field communication (NFC), but example embodiments are not limited thereto.

The RFIC 3200 may further include at least one fractional phase locked loop 3270. The fractional phase locked loop 3270 may be the fractional phase locked loop according to some example embodiments. For example, the fractional phase locked loop 3270 may include a fractional divider (FDIV) 3272 that includes a digital-to-time converter (DTC) and a phase shifter (PS), and the phase shifter may perform the course digital-to-time conversion based on the multi-phase clock signal MPCK. Accordingly, the dynamic range of the digital-to-time converter may be reduced, and the fractional divider 3272 and the fractional phase locked loop 3270 may have reduced power consumption and/or reduced size.

In some example embodiments, the fractional phase locked loop 3270 may be formed to correspond to each connectivity chip.

Various example embodiments may be applied to various electronic devices and systems that include the fractional dividers and the fractional phase locked loops. For example, inventive concepts may be applied to systems such as one or more of a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

Although an individual functional block may be illustrated as being included in another functional block, example embodiments are not necessarily limited thereto. For example, the functions performed by one block may alternatively or additionally be performed by another block.

Although one functional block may not be illustrated as being connected to another functional block, example embodiments are not necessarily limited thereto. For example, at least one functional block may communicate with at least another functional block, to send and/or to receive signals such as data and/or commands. The information may be digital, and/or may be analog. The communication may be serial, and/or may be parallel. The communication may be wireless, and/or may be wired. Example embodiments are not limited thereto.

The foregoing is illustrative of various example embodiments and is not to be construed as limiting thereof. Although some example embodiments have been described, those of ordinary skill in the art will readily appreciate that many modifications are possible in various example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims. Furthermore example embodiments are not necessarily mutually exclusive with one another. For example, some example embodiments may include one or more features described with reference to one or more drawings, and may also include one or more other features described with reference to one or more other embodiments.

What is claimed is:

1. A fractional divider comprising:
    processing circuitry configured to execute machine-readable instructions that, when executed by the processing circuitry, cause the processing circuitry:
    to receive one of a plurality of clock signals as an input clock signal, and generate a first division clock signal based on the input clock signal and a first control signal, phases of the plurality of clock signals at least partially overlapping each other;
    to generate a delta-sigma modulation signal based on the first division clock signal and on a frequency control word;
    to generate a second division clock signal based on the plurality of clock signals, the first division clock signal and a second control signal, the second control signal corresponding to a quantization noise of the generation of the delta-sigma modulation signal;
    to generate the second control signal and a digital control word based on the quantization noise of the generation of the delta-sigma modulation signal; and
    to generate a final division clock signal based on the second division clock signal and the digital control word.

2. The fractional divider of claim 1, wherein:
    the processing circuitry is configured to generate the final division clock signal by adding a time delay to the first division clock signal,
    the time delay corresponds to the quantization noise of the generation of the delta-sigma modulation signal, and includes a coarse time delay and a fine time delay, and
    the processing circuitry is configured to generate the coarse time delay, and to generate the fine time delay.

3. The fractional divider of claim 2, wherein the processing circuitry is configured:
    to select one of the plurality of clock signals based on the second control signal, and to output the selected one of the plurality of clock signals as a first selection clock signal;
    to mask the first selection clock signal based on the first division clock signal;
    to generate a second selection clock signal by delaying an output of the masking; and
    to generate the second division clock signal based on the first division clock signal and the second selection clock signal.

4. The fractional divider of claim 3, wherein, in response to the time delay being represented as a digital value including (M+K) bits, where each of M and K is a natural number, the coarse time delay corresponds to upper M bits among the (M+K) bits, and the fine time delay corresponds to lower K bits among the (M+K) bits.

5. The fractional divider of claim 3, wherein:
    the plurality of clock signals include first to $2^M$-th clock signals, where M is a natural number,
    the first to $2^M$-th clock signals have a first period, and
    a phase difference between two adjacent clock signals among the first to $2^M$-th clock signals corresponds to a value obtained by dividing the first period by $2^M$.

6. The fractional divider of claim 3, wherein the delta-sigma modulation signal is a 1-bit digital signal.

7. The fractional divider of claim 3, wherein the processing circuitry is further configured
    to generate a count signal based on the second selection clock signal; and
    to generate a comparison signal based on the count signal, the quantization noise of the generation of the delta-sigma modulation signal, and an offset signal, and
    wherein the processing circuitry is configured to generate the second division clock signal based on the first division clock signal and the comparison signal.

8. The fractional divider of claim 7, wherein, in response to the time delay being represented as a digital value including (X+M+K) bits, where each of X, M and K is a natural number, the coarse time delay corresponds to upper (X+M) bits among the (X+M+K) bits, and the fine time delay corresponds to lower K bits among the (X+M+K) bits.

9. The fractional divider of claim 8, wherein the processing circuitry is configured to determine the upper X bits among the (X+M) bits.

10. The fractional divider of claim 7, wherein the delta-sigma modulation signal is a 3-bit digital signal.

11. The fractional divider of claim 1, wherein the processing circuitry is further configured to
    generate the first control signal, and
    wherein:
        the frequency control word includes an integer part and a fractional part, and
        the processing circuitry is configured to generate the first control signal by adding the integer part of the frequency control word and the delta-sigma modulation signal.

12. The fractional divider of claim 11, wherein the processing circuitry is further configured to generate a difference signal by subtracting the delta-sigma modulation signal from the fractional part of the frequency control word.

13. The fractional divider of claim 12, wherein the processing circuitry is further configured to generate a quantization error signal based on the difference signal, the quantization error signal corresponding to the quantization noise of the generation of the delta-sigma modulation signal; and
    to generate the digital control word based on a third control signal corresponding to the quantization noise of the generation of the delta-sigma modulation signal.

14. The fractional divider of claim 13, wherein:
the quantization error signal is represented as a digital value including N bits, where N is a natural number,
the second control signal includes (M+1) bits among the N bits, where M is a natural number, and
the third control signal includes (K+1) bits different from the (M+1) bits among the N bits, where K is a natural number.

15. The fractional divider of claim 11, wherein the processing circuitry is configured to generate the delta-sigma modulation signal based on the first division clock signal and the fractional part of the frequency control word.

16. The fractional divider of claim 1, wherein:
the processing circuitry is configured to obtain the first division clock signal by an integer-division of the input clock signal, and
the processing circuitry is configured to obtain each of the second division clock signal and the final division clock signal by a fractional-division of the input clock signal.

17. A fractional phase locked loop comprising:
processing circuitry configured to execute machine-readable instructions that, when executed by a processor, cause the process:
generate a phase detection signal based on a reference clock signal and a feedback clock signal,
to generate an output control signal based on the phase detection signal,
to generate a plurality of clock signals based on the output control signal, and to output one of the plurality of clock signals as an output clock signal, phases of the plurality of clock signals partially overlapping each other, and
to generate the feedback clock signal by dividing the output clock signal,
wherein the processing circuitry is configured
to generate a first division clock signal based on the output clock signal and a first control signal,
to generate a delta-sigma modulation signal based on the first division clock signal and a frequency control word,
to generate a second division clock signal based on the plurality of clock signals, the first division clock signal and a second control signal, the second control signal corresponding to a quantization noise of the generation of the delta-sigma modulation signal,
to generate the second control signal and a digital control word based on the phase detection signal and the quantization noise of the generation of the delta-sigma modulation signal, and
to generate the feedback clock signal based on the second division clock signal and the digital control word.

18. The fractional phase locked loop of claim 17, wherein the processing circuitry is further configured to compensate delay errors of the plurality of clock signals based on the phase detection signal and the second control signal, the delay errors occurring due to path mismatch of the plurality of clock signals, and
to generate the output control signal based on the path mismatch calibration.

19. The fractional phase locked loop of claim 17, wherein:
the processing circuitry includes a time-to-digital converter,
a digital loop filter, and
a multi-phase digitally controlled oscillator.

20. A fractional divider comprising:
processing circuitry configured to execute machine-readable instructions that, when executed by the processing circuitry, cause the processing circuitry,
to receive one of a plurality of clock signals as an input clock signal, and to generate a first division clock signal based on the input clock signal and a first control signal, phases of the plurality of clock signals partially overlapping each other, the first division clock signal being obtained by an integer-division of the input clock signal,
to generate a delta-sigma modulation signal based on the first division clock signal and a frequency control word, the frequency control word including an integer part and a fractional part;
to generate the first control signal by adding the integer part of the frequency control word and the delta-sigma modulation signal;
to generate a second division clock signal based on the plurality of clock signals, the first division clock signal and a second control signal, the second control signal corresponding to a first portion of a quantization error signal corresponding to a quantization noise of the generation of the delta-sigma modulation signal, the second division clock signal being obtained by a fractional-division of the input clock signal;
to generate a difference signal by subtracting the delta-sigma modulation signal from the fractional part of the frequency control word;
to generate the quantization error signal by integrating the difference signal, and to generate the second control signal and a digital control word based on a third control signal, the third control signal corresponding to a second portion of the quantization error signal different from the first portion of the quantization error signal; and
to generate a final division clock signal based on the second division clock signal and the digital control word, the final division clock signal being obtained by a fractional-division of the input clock signal,
wherein:
the processing circuitry is configured to generate the final division clock signal by adding a time delay to the first division clock signal,
the time delay corresponds to the quantization noise of the generation of the delta-sigma modulation signal, and includes a coarse time delay and a fine time delay, and
in response to the time delay being represented as a digital value including (M+K) bits, where each of M and K is a natural number, the processing circuitry is configured to generate the coarse time delay corresponding to upper M bits among the (M+K) bits, and the processing circuitry is configured to generate the fine time delay corresponding to lower K bits among the (M+K) bits.

* * * * *

UNITED STATES PATENT AND TRADEMARK OFFICE
CERTIFICATE OF CORRECTION

| | | |
|---|---|---|
| PATENT NO. | : 11,777,510 B2 | Page 1 of 1 |
| APPLICATION NO. | : 17/964377 | |
| DATED | : October 3, 2023 | |
| INVENTOR(S) | : Baekmin Lim et al. | |

It is certified that error appears in the above-identified patent and that said Letters Patent is hereby corrected as shown below:

On the Title Page

At Column 1, insert below item (22):
--(30) Foreign Application Priority Data
November 29, 2021 (KR) .....................KR 10-2021-0166785--

Signed and Sealed this
Nineteenth Day of December, 2023

Katherine Kelly Vidal
*Director of the United States Patent and Trademark Office*